United States Patent [19]

Nishi et al.

[11] Patent Number: 5,894,341
[45] Date of Patent: Apr. 13, 1999

[54] EXPOSURE APPARATUS AND METHOD FOR MEASURING A QUANTITY OF LIGHT WITH TEMPERATURE VARIATIONS

[75] Inventors: Kenji Nishi, Kanagawa-ken; Toshihiko Tsuji, Chiba-ken, both of Japan

[73] Assignee: Nikon Corporation, Tokyo, Japan

[21] Appl. No.: 08/677,365

[22] Filed: Jul. 5, 1996

[30] Foreign Application Priority Data

Jul. 6, 1995 [JP] Japan .................. 7-170715

[51] Int. Cl.$^6$ .................... G03B 27/74; G03B 27/80; G03B 27/42; H01J 7/24
[52] U.S. Cl. ................... 355/68; 355/30; 355/53; 250/238
[58] Field of Search .................... 355/53, 68, 67, 355/71, 30; 250/214 C, 214 R, 548, 238

[56] References Cited

U.S. PATENT DOCUMENTS

| | | | |
|---|---|---|---|
| 4,432,635 | 2/1984 | Mayer | 355/30 |
| 4,479,708 | 10/1984 | Tokuda | 250/214 C |
| 4,668,077 | 5/1987 | Tanaka | 355/30 |
| 4,712,910 | 12/1987 | Sakato . | |
| 4,720,732 | 1/1988 | Tsutsui | 355/30 |
| 4,853,745 | 8/1989 | Kamiya et al. . | |
| 5,041,865 | 8/1991 | Asano et al. | 355/30 |
| 5,045,683 | 9/1991 | Kanda | 250/214 C |
| 5,063,582 | 11/1991 | Mori et al. | 355/30 |
| 5,266,792 | 11/1993 | Crowne et al. | 250/214 C |
| 5,329,336 | 7/1994 | Hirano et al. | 355/53 |
| 5,581,324 | 12/1996 | Miyai et al. | 355/53 |

FOREIGN PATENT DOCUMENTS 4-225358  8/1992  Japan .

*Primary Examiner*—R. L. Moses
*Assistant Examiner*—Shival Virmani
*Attorney, Agent, or Firm*—Armstrong, Westerman, Hattori, McLeland, & Naughton

[57] ABSTRACT

A reticle and a wafer are relatively scanned in a scanning exposure type of projection exposure apparatus so that a pattern on the reticle is transferred onto the wafer by exposure. Heat exchangers which has the Peltier device are provided on a side surface of an integrator sensor which measures the quantity of exposure to control temperature of a photosensitive surface of the integrator sensor. In a side of heat irradiation surface of the heat exchangers, cooling water is circulated so that the heat exchangers are cooled. Saturation temperature at which temperature of the photosensitive surface is saturated when an illumination beam is irradiated to the photosensitive surface is determined and then the quantity of light irradiated to the photosensitive surface is measured with the temperature of the photosensitive surface being maintained at the saturation temperature. Based on the relation determined in advance between temperature of the photosensitive surface and the sensitivity of the integrator sensor at the saturation temperature, values of the quantity of light measured are corrected and then intensity of a light source is controlled by a main control system based on the corrected quantity of light.

77 Claims, 9 Drawing Sheets

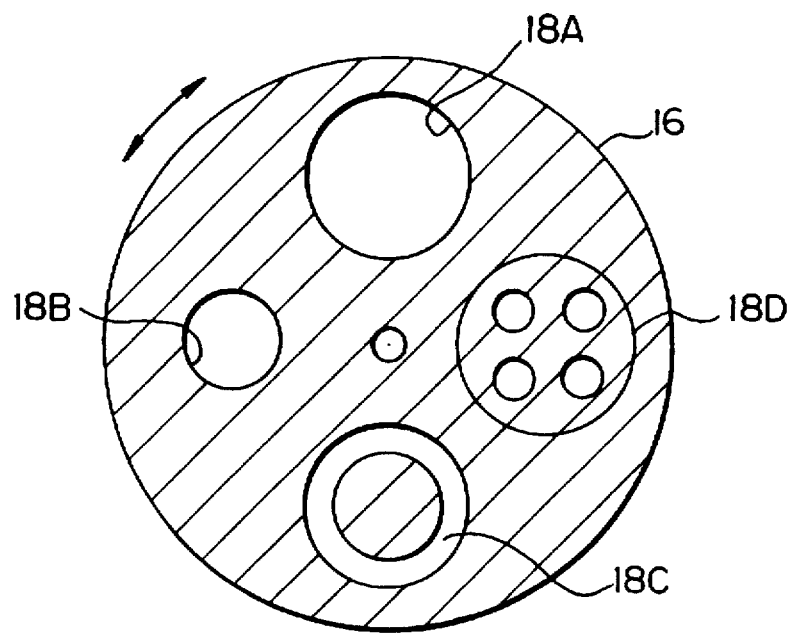
Fig. 4
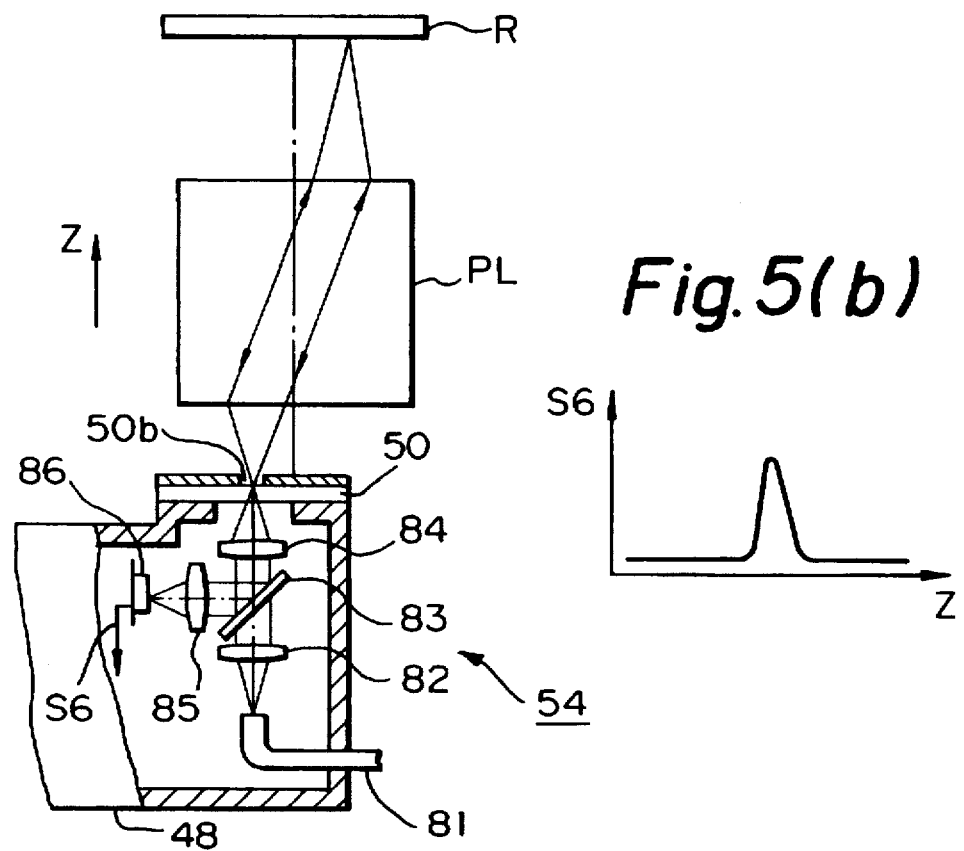
Fig. 5(a)
Fig. 5(b)

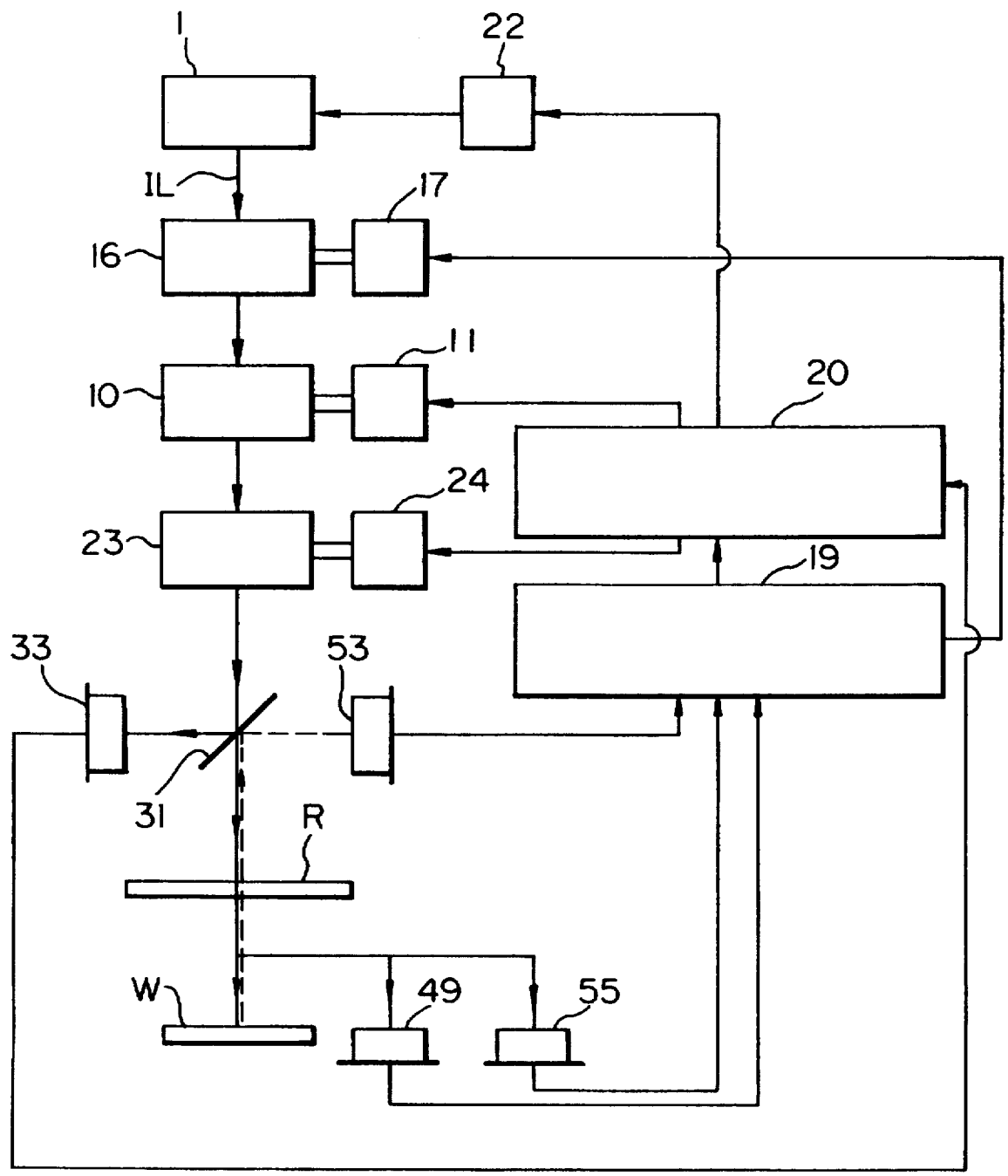

EXPOSURE APPARATUS AND METHOD FOR MEASURING A QUANTITY OF LIGHT WITH TEMPERATURE VARIATIONS

BACKGROUND OF THE INVENTION

The present invention relates to an exposure apparatus for use in a photolithographic process for fabricating semiconductor devices, liquid crystal displays, image sensors, such as CCDs, thin-film magnetic heads or others. More particularly, the present invention relates to a technique suitably applying to a scanning exposure type of exposure apparatus such as a so-called slit-scanning type or step-and-scanning type exposure apparatus, with which a pattern shaped on a mask is sequentially transferred by exposure onto a photosensitive substrate by synchronously scanning the mask and the photosensitive substrate in respect to an illumination area that is, for example, a rectangular or an arc in shape.

Conventionally, the exposure apparatuses had been used for fabricating semiconductor devices, etc. are one-shot exposure type of exposure apparatuses such as steppers, etc. with which a pattern shaped on a reticle (or a photomask) is transferred to each shot area on a wafer (or a glass plate, etc.) on which photoresist is applied, through an optical projection system by a exposure method of step-and-repeat type. Such type of the exposure apparatuses have an illuminance control unit by which quantity of exposure (i.e., exposure energy) to each shot area on the wafer can be controlled within appropriate range.

FIG. 11 shows a conventional stepper-type of projection exposure apparatus which has an illuminance control system. In FIG. 11, an illumination beam emitted from a mercury-vapor lamp 101 is gathered by an ellipsoidal mirror 102 and then enters a shutter 104 through a condenser filter system 103. The condenser filter system 103 comprises a condenser optical system 103a and an optical filter 103b through which a light having a desired wave-length band, e.g., i-rays, selectively passes. The shutter 104 is opened or closed by a shutter control unit 105 according to an order from a timer control system 106. The shutter 104 is operable to open and close by means of a shutter control system 105 based on an order from a timer control system 106. When the shutter 104 is open, the illumination beam is substantially collimated by an input lens 107 to reach a fly-eye lens 108.

The fly-eye lens 108 forms a plurality of images of the light source at an exit surface thereof so that illumination distribution on a reticle 119 of the illumination beam becomes uniform. A turret plate 122, on which a plurality kind of an illumination-system-aperture-stop are formed, is disposed near the exit surface of the fly-eye lens 108. The illumination beam which passes through a predetermined illumination-system-aperture-stop enters a mirror 109 which has a reflectivity of about 98%. The illumination beam reflected by the mirror 109 passes through a first relay lens 113 and then a part of the illumination beam reflected is limited to a constant illumination area on a blind (a variable field stop) 114. The illumination beam passing through the blind 114 is relayed by a second relay lens 116, a mirror 117 and a condenser lens 118 so as to illuminate an illumination area on the reticle 119 with uniform illumination distribution. By this unified illumination beam, a pattern on the reticle 119 is transferred to each shot area on a wafer 121 by exposure through a projection optical system 120 with, for example, the reduction rate of one fifth.

When the illumination beam enters the mirror 109, a leakage light passing through the mirror 109 enters an integrator sensor 111 comprising a photodetector through a condensing lens 110. The integrator sensor 111 emits output signal corresponding to illuminance of the leakage light and the output signal is provided to an illuminance calculation system 112. The photosensitive surface of the integrator sensor 111 is positioned in a plane optically conjugate to a plane of, for example, a pattern bearing surface of the reticle 119. A scaling factor giving a relation between the exposure energy per unit time of the illumination light irradiated to the wafer 121 and the illuminance on the integrator sensor 111 is memorized in advance. At the illuminance calculation system 112, by calculating a product of a strength of the output signal emitted from the integrator sensor 111 and the scaling factor, the exposure energy per unit time of the illumination light irradiated to the wafer 121 is gained. The data with respect to the exposure energy per unit time is provided with a main control system 125 in which exposure time is gained by dividing the appropriate exposure to be irradiated onto the wafer 121 by the exposure energy per unit time. The exposure time is inputted to the timer control system 106. The shutter 104 is controlled by the timer control system 106 so as to be open only for the exposure time so that the accumulated exposure on the wafer 121 is controlled to be equal to the appropriate exposure.

Recently, in order to raise resolution and focal depth when a pattern on a reticle having a small and cyclical pitch is transferred by exposure, the modified illumination method (refer to Japanese Patent Disclosure No. HEI 4-225358 (1992/225358), corresponding to U.S. patent application Ser. No. 791,138 filed on Nov. 13, 1991) in which an illumination-system-aperture-stop has a plurality of apertures eccentrically shaped with respect to an optical axis, the annular illumination method in which the illumination-system-aperture-stop has a circular zone and etc. are proposed. In the apparatus shown in FIG. 11, also, the aperture stop for the modified illumination method and the aperture stop having the circular zone for the annular illumination method are shaped in the turret plate 122. When the main control system 125 supplies information about a pattern to be transferred by exposure to an illumination-system-aperture-stop-control-system 124, the turret plate 122 is rotated by a motor 123 so that the appropriate illumination-system-aperture-stop is selectively set to an exit surface of the fly-eye lens 108.

Thus, when the shape of the illumination-system-aperture-stop changes, the number and distribution of images of a light source in the illumination-system-aperture-stop change so that illuminance on the wafer 121 changes. In the one-shot exposure type of the exposure apparatus, even if the illuminance on the wafer 121 changes as described above, the exposure irradiated onto each shot area on the wafer can be always appropriately controlled by taking, for example, such a manner that an output signal from the integrator sensor 111 which has a photosensitive surface positioned in a plane optically about conjugate to a photosensitized surface of the wafer 121 is monitored so that the time for which the shutter 104 is open is controlled according to the output signal.

In the one-shot exposure type of the exposure apparatus, illuminance unevenness in a surface on the wafer to be irradiated is controlled by the fly-eye lens 108, etc. as an optical integrator. Also, because the shutter 104 is controlled by indirectly monitoring the accumulated exposure irradiated onto the wafer 121 with the output signal from the integrator sensor 111, stability with time of the illuminance in each shot area on the wafer 121 has not been questioned. Further, even if illumination condition in the modified illumination method, etc. between the integrator sensor 111 and the light source (or the mercury-vapor lamp 101) is altered, the time until which the accumulated exposure amounts to the desired value only changes and therefore there is nothing to be particularly inconvenient.

The prior art stated above is the one-shot exposure type of the exposure apparatus in which the pattern is transferred by exposure to each shot area on the wafer by once open-and-shut-action of the shutter, respectively, with the reticle and the wafer being static with respect to a projection optical system and which has the illuminance control mechanism. In such one-shot exposure type of the exposure apparatus, there is nothing to be particularly inconvenient on control of illuminance.

Meanwhile, recently, an one chip pattern for a semiconductor and the like has come to have a larger and larger size so that the projection exposure apparatus is required to have a larger size for efficiently projecting a pattern with a larger area onto the wafer. To project the pattern with the larger area onto the wafer, it will be particularly necessary to control distortion in the entire surface of the wafer so as to be lower than a predetermined value. Therefore, to decrease the distortion in the entire surface of the wafer and project the pattern with the larger area onto the wafer, a scanning exposure type of projection exposure apparatus, for example, a so-called step-and-scanning type or slit scanning type of projection exposure apparatus has been reconsidered. In the scanning exposure type of projection exposure apparatus, the reticle and the photosensitized plate are synchronously scanned with respect to a radiating region which has a shape of, for example, rectangular, circular arc, a plurality of trapezoid and etc. (hereinafter called a slit radiating region) so that the pattern on the reticle is successively transferred to each shot area by exposure.

In case of applying the method of controlling the accumulated exposure of the prior art as described above to the scanning exposure type of projection exposure apparatus, various inconveniences occur. First, in the scanning exposure type of projection exposure apparatus, the accumulated exposure irradiated in each shot area is controlled by such a manner that the accumulated exposure in a slit-like exposure field is maintained at a constant at all points of the wafer. If the accumulated exposures at each points of the wafer are different from one another, unevenness of the accumulated exposure arises. This unevenness results in the same errors as the illuminance unevenness in the surface on the wafer to be irradiated when the one-shot exposure type of the exposure apparatus is used.

A constant-illuminance-control-method is known as a method for avoiding this unevenness. This is such a method that the output from the integrator sensor is directly returned to a power supply source and then illuminance on the wafer is controlled based on the output so that the illuminance on the wafer is maintained at a constant. However, the exposure, or the absolute exposure, irradiated per unit time to the entire exposure field by the scanning exposure method is larger than that by the one-shot exposure method because an illumination area in the scanning exposure method is narrower than that in the one-shot exposure method. It will be necessary to make the variable range of the exposure larger because it is necessary to vary the accumulated exposure within a large range according to a photographic sensitivity of a resist.

However, when the variable range of the exposure is made larger, if SN ratio of the output from the integrator sensor is intended to be maintained at a value larger than the predetermined value when both the quantity of light irradiated is large and that is small, a lot of quantity of light (in case of continuous light beam, illuminance or the light energy per unit time of the entire light beam irradiated) is irradiated to the integrator sensor. Therefore, there is such an inconvenience that temperature of the integrator sensor changes when measuring the quantity of light so that sensitivity of the sensor changes. Further, the quantity of light irradiated onto the wafer stage in the scan exposure method is larger than that in the one-shot exposure method. Therefore, when the illumination light with the quantity of light over a wide range is irradiated to an illuminance unevenness sensor which is a photoelectric sensor on the wafer stage and an exposure monitor which is a photoelectric sensor for measuring the quantity of light reflected by the wafer, a change in temperature which cannot be disregarded occurs so that the change in temperature causes an inconvenience such that a sensitivity of the sensor changes.

In view of the above-described problems, an object of the present invention is to provide an exposure apparatus such that an error when the quantity of light is measured with a sensor for measuring the quantity of light is small and an output signal having a high SN ratio is gained even if the quantity of irradiation changes within a wide range, and the quantity of irradiation or the accumulated exposure can be measured with high-accuracy.

SUMMARY OF THE INVENTION

To attain the above-described object, the present invention provides an exposure apparatus comprising: an illumination optical system for illuminating a mask on which a pattern to be transferred is formed with an illumination beam, the pattern on the mask being transferred onto a photosensitized substrate by exposure with the illumination beam; a photoelectric sensor for measuring the quantity of light of at least a part of the illumination beam; a temperature detector for detecting temperature of a photosensitive surface of the photoelectric sensor; and a correction system for correcting information on the quantity of light measured by the photoelectric sensor based on the temperature detected by the temperature detector.

In addition, the present invention provides an exposure apparatus comprising: an illumination optical system for illuminating a mask on which a pattern to be transferred is formed with an illumination beam, the pattern on the mask being transferred onto a photosensitized substrate by exposure with the illumination beam; a photoelectric sensor for measuring the quantity of light of at least a part of the illumination beam; a temperature detector for detecting temperature of a photosensitive surface of the photoelectric sensor; and a temperature controller for controlling temperature of a photosensitive surface of the photoelectric sensor, the quantity of light of at least a part of the illumination beam being measured by the photoelectric sensor with the photosensitive surface of the photoelectric sensor being maintained at a predetermined temperature which is equal to or is lower than saturation temperature by controlling the temperature controller based on values detected by the temperature detector.

In addition, the present invention provides an exposure apparatus comprising: an illumination optical system for illuminating a mask on which a pattern to be transferred is formed with an illumination beam, said pattern on said mask being transferred onto a photosensitized substrate by exposure with said illumination beam; a photoelectric sensor for measuring the quantity of light of at least a part of said illumination beam; and a memory for memorizing a characteristic of sensitivity of said photoelectric sensor at when temperature of said photosensitive surface of said photoelectric sensor is equal to saturation temperature, said quantity of light of at least a part of said illumination beam being calculated based on an output from said photoelectric sensor and said characteristic of sensitivity of said photoelectric sensor memorized in said memory, said output from said photoelectric sensor being obtained by measuring the quantity of light with said photoelectric sensor after temperature of said photosensitive surface of said photoelectric sensor reaches substantially constant saturation temperature.

In addition, the present invention provides an exposure apparatus comprising: an illumination optical system for illuminating a mask on which a pattern to be transferred is formed with an illumination beam, said pattern on said mask being transferred onto a photosensitized substrate by exposure with said illumination beam; a photoelectric sensor for measuring the quantity of light of at least a part of said illumination beam; a temperature detector for detecting temperature of a photosensitive surface of said photoelectric sensor; and a memory for memorizing a relation between temperature of said photosensitive surface of said photoelectric sensor and a characteristic of sensitivity of said photoelectric sensor at that temperature, said quantity of light of at least a part of said illumination beam being obtained in such a way that values measured by said photoelectric sensor when temperature of said photosensitive surface of said photoelectric sensor is any temperature are corrected by use of said characteristic of sensitivity of said photoelectric sensor at said any temperature obtained from said relation.

In the above exposure apparatus, said photoelectric sensor is at least one selected out of a group comprising a photoelectric sensor for measuring the quantity of light of a light flux separated from said illumination beam in said illumination optical system, a photoelectric sensor, which is provided on the same plane as a surface of said photosensitized substrate, for measuring the quantity of light of a part of said illumination beam which is irradiated onto said photosensitized substrate, and a photoelectric sensor, which is provided on the same plane as the surface of said photosensitized substrate, for measuring the quantity of light of the entire illumination beam which is irradiated onto said photosensitized substrate.

Further, the present invention provides an exposure method wherein a pattern to be transferred formed on a mask is illuminated with an illumination beam and is transferred onto a photosensitized substrate by exposure, said exposure method comprising the steps of: preparing a photoelectric sensor for measuring the quantity of light of at least a part of said illumination beam; detecting temperature of a photosensitive surface of said photoelectric sensor; correcting information on the quantity of light measured by said photoelectric sensor based on temperature of said photosensitive surface detected by said temperature detector; and irradiating said illumination beam onto said photosensitized substrate in such a way that the accumulated exposure irradiated onto said photosensitized substrate, which is calculated based on the information on the quantity of light corrected in said correcting step, is equal to a predetermined quantity of exposure, so that said pattern is transferred onto said photosensitized substrate by exposure.

In addition, the present invention provides an exposure method wherein a pattern to be transferred formed on a mask is illuminated with an illumination beam and is transferred onto a photosensitized substrate by exposure, said exposure method comprising the steps of: preparing a photoelectric sensor for measuring the quantity of light of at least a part of light flux of said illumination beam; detecting temperature of a photosensitive surface of said photoelectric sensor; controlling temperature of a photosensitive surface of said photoelectric sensor at a predetermined temperature which is equal to or is lower than saturation temperature based on temperature of the photosensitive surface detected in said detecting step; measuring said quantity of light by said photoelectric sensor at said predetermined temperature; correcting information on said quantity of light measured in said measuring step according to said predetermined temperature; and irradiating said illumination beam onto said photosensitized substrate in such a way that the accumulated exposure irradiated onto said photosensitized substrate, which is calculated based on the information on the quantity of light corrected in said correcting step, is equal to a predetermined quantity of exposure, so that said pattern is transferred onto said photosensitized substrate by exposure.

In addition, the present invention provides an exposure method wherein a pattern to be transferred formed on a mask is illuminated with an illumination beam and is transferred onto a photosensitized substrate by exposure, said exposure method comprising the steps of: preparing a photoelectric sensor for measuring the quantity of light of at least a part of said illumination beam; memorizing a characteristic of sensitivity of said photoelectric sensor at when temperature of a photosensitive surface of said photoelectric sensor is equal to saturation temperature; measuring the quantity of light with said photoelectric sensor after temperature of said photosensitive surface of said photoelectric sensor reaches substantially constant saturation temperature; calculating said quantity of light of at least a part of said illumination beam based on an output from said photoelectric sensor and said characteristic of sensitivity of said photoelectric sensor memorized in said memorizing step; and irradiating said illumination beam onto said photosensitized substrate in such a way that the accumulated exposure irradiated onto said photosensitized substrate, which is calculated based on said quantity of light calculated in said calculating step, is equal to a predetermined quantity of exposure, so that said pattern is transferred onto said photosensitized substrate by exposure.

In addition, the present invention provides an exposure method wherein a pattern to be transferred formed on a mask is illuminated with an illumination beam and is transferred onto a photosensitized substrate by exposure, said exposure method comprising the steps of: preparing a photoelectric sensor for measuring the quantity of light of at least a part of said illumination beam; detecting temperature of a photosensitive surface of said photoelectric sensor; memorizing a relation between temperature of said photosensitive surface of said photoelectric sensor and a characteristic of sensitivity of said photoelectric sensor at that temperature; measuring said quantity of light of at least a part of said illumination beam by said photoelectric sensor when temperature of said photosensitive surface of said photoelectric sensor is any temperature; correcting said quantity of light by use of said characteristic of sensitivity of said photoelectric sensor at said any temperature obtained from said relation; and irradiating said illumination beam onto said photosensitized substrate in such a way that the accumulated exposure irradiated onto said photosensitized substrate, which is calculated based on said quantity of light calculated in said calculating step, is equal to a pre-determined quantity of exposure, so that said pattern is transferred onto said photosensitized substrate by exposure.

In addition, the present invention provides an exposure method wherein a pattern of a mask is moved at a first speed relative to an object-side projection field of an optical projection system, and a plurality of shot regions on a photosensitive substrate onto which said mask pattern is to be transferred are moved at a second speed relative to an image-side projection field of said optical projection system, thereby scanning each shot region on said photosensitive substrate, and transferring said mask pattern over each shot region by exposure, said method comprising the steps of: preparing a photoelectric sensor for measuring the quantity of light of at least a part of light flux of said illumination beam; detecting temperature of a photosensitive surface of said photoelectric sensor; correcting information on the quantity of light measured by said photoelectric sensor based on temperature of said photosensitive surface detected by said temperature detector; and irradiating said illumination beam onto said photosensitized substrate in such a way that the accumulated exposure irradiated onto each shot region on said photosensitized substrate, which is calculated based on the information on the quantity of light corrected in said correcting step, is equal to a predetermined quantity of exposure, so that said pattern is transferred onto said photosensitized substrate by exposure.

In addition, the present invention provides an exposure method wherein a pattern of a mask is moved at a first speed relative to an object-side projection field of an optical projection system, and a plurality of shot regions on a photosensitive substrate onto which said mask pattern is to be transferred are moved at a second speed relative to an image-side projection field of said optical projection system, thereby scanning each shot region on said photosensitive substrate, and transferring said mask pattern over each shot region by exposure, said method comprising the steps of: preparing a photoelectric sensor for measuring the quantity of light of at least a part of said illumination beam; detecting temperature of a photosensitive surface of said photoelectric sensor; controlling temperature of a photosensitive surface of said photoelectric sensor at a predetermined temperature which is equal to or is lower than saturation temperature based on temperature of the photosensitive surface detected in said detecting step; measuring said quantity of light by said photoelectric sensor at said predetermined temperature; correcting information on said quantity of light measured in said measuring step according to said predetermined temperature; and irradiating said illumination beam onto said photosensitized substrate in such a way that the accumulated exposure irradiated onto each shot region on said photosensitized substrate, which is calculated based on the information on the quantity of light corrected in said correcting step, is equal to a predetermined quantity of exposure, so that said pattern is transferred onto said photosensitized substrate by exposure.

In addition, the present invention provides an exposure method wherein a pattern of a mask is moved at a first speed relative to an object-side projection field of an optical projection system, and a plurality of shot regions on a photosensitive substrate onto which said mask pattern is to be transferred are moved at a second speed relative to an image-side projection field of said optical projection system, thereby scanning each shot region on said photosensitive substrate, and transferring said mask pattern over each shot region by exposure, said method comprising the steps of: preparing a photoelectric sensor for measuring the quantity of light of at least a part of said illumination beam; memorizing a characteristic of sensitivity of said photoelectric sensor at when temperature of a photosensitive surface of said photoelectric sensor is equal to saturation temperature; measuring the quantity of light with said photoelectric sensor after temperature of said photosensitive surface of said photoelectric sensor reaches substantially constant saturation temperature; calculating said quantity of light of at least a part of said illumination beam based on an output from said photoelectric sensor and said characteristic of sensitivity of said photoelectric sensor memorized in said memorizing step; and irradiating said illumination beam onto said photosensitized substrate in such a way that the accumulated exposure irradiated onto each shot region on said photosensitized substrate, which is calculated based on said quantity of light calculated in said calculating step, is equal to a predetermined quantity of exposure, so that said pattern is transferred onto said photosensitized substrate by exposure.

In addition, the present invention provides an exposure method wherein a pattern of a mask is moved at a first speed relative to an object-side projection field of an optical projection system, and a plurality of shot regions on a photosensitive substrate onto which said mask pattern is to be transferred are moved at a second speed relative to an image-side projection field of said optical projection system, thereby scanning each shot region on said photosensitive substrate, and transferring said mask pattern over each shot region by exposure, said method comprising the steps of: preparing a photoelectric sensor for measuring the quantity of light of at least a part of light flux of said illumination beam; detecting temperature of a photosensitive surface of said photoelectric sensor; memorizing a relation between temperature of said photosensitive surface of said photoelectric sensor and a characteristic of sensitivity of said photoelectric sensor at that temperature; measuring said quantity of light of at least a part of said illumination beam by said photoelectric sensor when temperature of said photosensitive surface of said photoelectric sensor is any temperature; correcting said quantity of light by use of said characteristic of sensitivity of said photoelectric sensor at said any temperature obtained from said relation; and irradiating said illumination beam onto said photosensitized substrate in such a way that the accumulated exposure irradiated onto each shot region on said photosensitized substrate, which is calculated based on said quantity of light calculated in said calculating step, is equal to a predetermined quantity of exposure, so that said pattern is transferred onto said photosensitized substrate by exposure.

According to the exposure apparatus of the first aspect of the present invention, for example, as shown in FIGS. 8(a) and 8(b), temperature of the photosensitive surface of the photoelectric sensor is measured by the temperature detector and then the relation between temperature T of the photosensitive surface, for example, shown in FIG. 9(b) and a change of electric current ΔI outputted from the photoelectric sensor is memorized in the correction system. By correcting values measured by the photoelectric sensor based on that relation with the correction system, errors on measurement can be decreased. Further, by providing the temperature detector and the correction system, even if the quantity of light changes within a wide range so that temperature of the photosensitive surface changes within a wide extent, it is not necessary to limit the quantity of light which enters the photoelectric sensor since values measured by the photoelectric sensor can be corrected. Accordingly, SN ratio of output signal emitted from the photoelectric sensor which is more than a predetermined value can be obtained.

According to the exposure apparatus of the second aspect of the present invention, for example, as shown in FIGS.

8(a) and 8(b), adding to the exposure apparatus of the first aspect of the present invention, the temperature controller which controls temperature of the photosensitive surface of the photoelectric sensor is provided. Temperature of the photosensitive surface is controlled to the desired temperature by the temperature controller and then values measured by the photoelectric sensor are corrected based on, for example, the relation shown in FIG. 9(b) stated above. In this case, productivity (throughput) is further improved since time until which temperature of the photosensitive surface reaches the desired temperature is cut down. Further, if temperature of the photosensitive surface is set to the desired temperature with the temperature controller in advance before exposure, time for measurement is further shortened and, as a result, the productivity is more further improved. Further, since it is not necessary to limit the quantity of light, similar to the first exposure apparatus of the present invention, SN ratio of output signal emitted from the photoelectric sensor which is more than a predetermined value can be obtained.

According to the exposure apparatus of the third aspect of the present invention, the quantity of light is measured with the photoelectric sensor after temperature of the photosensitive surface of the photoelectric sensor reaches the saturation temperature, for example, as shown in FIG. 9(a). Then, the values measured by the photoelectric sensor can be corrected based on a characteristic of sensitivity of the photoelectric sensor at the saturation temperature, for example, shown in FIG. 9(b) which is memorized in a memory. In this case, the temperature control device that is provided with the second exposure apparatus of the present invention is not necessary. Further, if the time at which temperature of the photosensitive surface reaches the saturation temperature can be known in advance, the temperature detector that is provided with the first and second exposure apparatuses of the present invention is not necessary. In the third exposure apparatus, only the condition that the characteristic of sensitivity of the photoelectric sensor at the saturation temperature is memorized in the memory, the values measured by the photoelectric sensor can be corrected. Accordingly, the third exposure apparatus has an advantage in aspects of both structure and control and also can accurately measure the quantity of light.

Further, in the first to third exposure apparatuses, the photoelectric sensor is at least one selected out of a group comprising a photoelectric sensor (or an integrator sensor) for measuring the quantity of light of a part of light flux separated from the illumination beam in the illumination optical system, a photoelectric sensor (or an illuminance unevenness sensor), which is provided on the same plane as a surface of the photosensitized substrate, for measuring the quantity of light of a part of the illumination beam which is irradiated onto the photosensitized substrate, and a photoelectric sensor (or an radiation monitor), which is provided on the same plane as the surface of the photosensitized substrate, for measuring the quantity of light of the entire illumination beam which is irradiated onto the photosensitized substrate. Accordingly, illuminance unevenness and illuminance during the actual exposure can be accurately measured.

BRIEF DESCRIPTION OF THE DRAWINGS

FIG. 4 schematically shows a plurality of illumination-system-aperture-stop positioned on an illumination-system-aperture-stop disk in FIG. 1.

FIG. 5(a) schematically shows a main portion of a mechanism for focus calibration.

FIG. 5(b) is a wave-shape of a detection signal gained by the mechanism of FIG. 5(a).

FIG. 7 schematically shows an exposure control system used in the embodiment of FIG. 1.

DETAILED DESCRIPTION OF PREFERRED EMBODIMENTS

One embodiment of an exposure apparatus of the present invention will be described with reference to FIGS. 1 to 10(b). This embodiment is applied to a step-and-scan exposure type of projection exposure apparatus.

Figure 1:
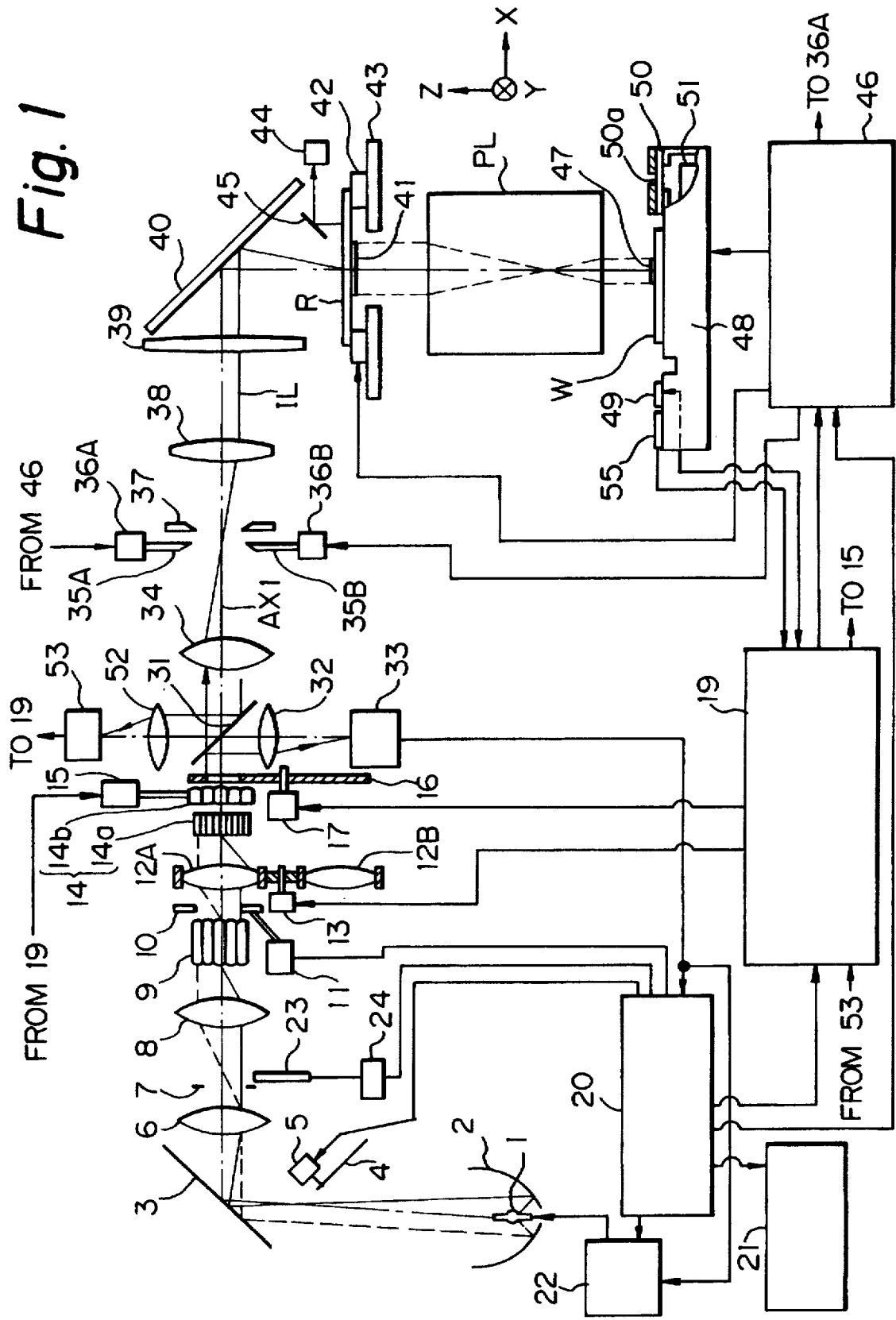
FIG. 1 schematically shows an arrangement of a scanning exposure type of projection exposure apparatus according to one embodiment of the present invention as well as a partial cross-section of the arrangement.

FIG. 1 shows a projection exposure apparatus of present embodiment. In the FIG. 1, an illumination beam emitted from a mercury-vapor lamp 1 is collected by an ellipsoidal mirror 2. A shutter 4, which can be selectively opened and shut by a shutter control system 5, is disposed close to a collecting point of the illumination beam. When the shutter 4 is open, the illumination beam passes through a mirror 3 and an input lens 6 so as to be changed to a parallel beam and then is reached to a field stop 7. A dimmer plate 23 is disposed just behind the field stop 7. The quantity of the illumination light passing through the field stop 7 can be stepwise or continuously changed by controlling a degree to which the dimmer plate 23 blocks off a light path of the illumination beam.

The dimmer plate 23 may comprise a plurality of reflective semitransparent mirrors arranged to be selectively positioned to an operable position and having tilt angles so selected that the transmittance established by the dimmer plate 23 may be set to one of predetermined transmittances.

The dimmer plate 23 may be stepped by means of a dimmer plate drive unit 24 including a drive motor, so that the quantity of light of the illumination beam may be adjusted. In this embodiment, the control of the exposure on the wafer W is achieved by an exposure control system 20 which controls the operation of the dimmer plate drive unit 24 as well as the operation of the shutter control unit 5. Also, the exposure control system 20 controls a power supply system 22 for the mercury-vapor lamp 1 so as to control an electric current supplied to the mercury-vapor lamp 1.

The illumination beam, having passed through the aperture of the field stop 7 and been adjusted in its quantity of light by the dimmer plate 24, passes through a first relay lens 8 into a first fly-eye lens 9 of a two-stage fly-eye lens arrangement. The first fly-eye lens 9 forms a plurality of images of the light source which emit respective light beams to be mingled into a new illumination beam. This illumination beam is directed through a second-stage relay lens 12A into a second fly-eye lens 14. In this embodiment, there is disposed a variable stop 10 close to the exit surface of the first fly-eye lens 9, which exit surface provides an image forming plane in which the plurality of images of the light source are formed. The aperture of the variable stop 10 may be adjusted by means of a variable stop drive unit 11 to any desired size. The operation of the variable stop drive unit 11 is also controlled by the exposure control system 20. In this embodiment, the quantity of light of the illumination beam travelling from the first fly-eye lens 9 to the second fly-eye lens 14 may be continuously adjusted by varying the size of the aperture of the variable stop 10.

Figure 2A:
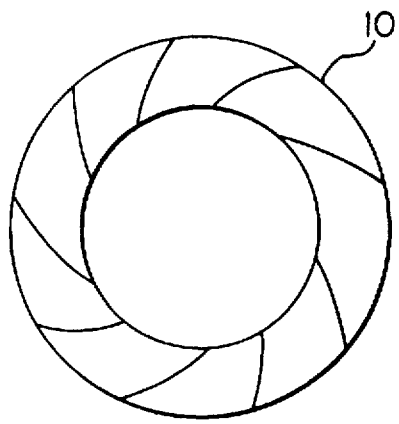
FIGS. 2(A) and 2(B) illustrate examples of variable field stops used in the embodiment.
Figure 2B:
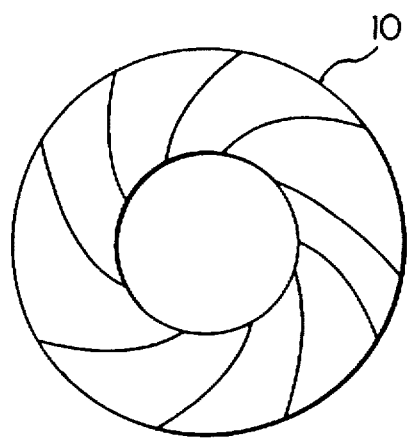

FIG. 2(a) illustrates an example of the variable stop 10. As shown, the variable stop 10 of FIG. 2(a) comprises an iris diaphragm having a control lever (not shown). The diameter of the generally circular aperture of the iris diaphragm can be continuously adjusted, as shown in FIG. 2(b), by the actuation of the control lever.

Referring again to FIG. 1, there has been developed in recent years a technique for enhancing focal depth for a given pattern by reducing the numerical aperture of the illumination optical system, and thus reducing the coherence factor (or σ value), i.e., the ratio of the numerical aperture of the illumination optical system to that of the projection optical system. Reduction in the a value results in a reduction in the illuminance on the reticle established by the illumination beam. This embodiment includes means for preventing such reduction in the illuminance on the reticle, which comprises an adjustment mechanism for adjusting the extent of the illumination area on the entrance surface of the second fly-eye lens 14.

The adjustment mechanism comprises a first second-stage relay lens 12A, a second-stage relay lens 12B having a greater focal power than the first second-stage relay lens 12A and a changer mechanism 13 for selectively positioning one of the second-stage relay lenses 12A and 12B at an operative position. The operation of the changer mechanism 13 is controlled by the main control system 19 which serves to generally control the operations of the entire projection exposure apparatus of this embodiment. When the illumination is to be performed with an ordinary σ value, the change mechanism 13 positions the first second-stage relay lens 12A at the operative position between the first and second fly-eye lenses 9 and 14, with the result that almost the entire entrance surface of the second fly-eye lens 14 is illuminated by the illumination light. On the other hand, when the illumination is to be performed with a reduced σ value (i.e., with a reduced numerical number of the illumination optical system), the changer mechanism 13 has the second-stage relay lens 12B at the operative position between the first and second fly-eye lenses 9 and 14, with the result that only the central portion of the entrance surface of the second fly-eye lens 14 is illuminated by the illumination beam. Thus, when the reduced a value is selected, the illuminance of the illumination beam in the illuminated area on the second fly-eye lens 14 is increased, so that the illuminances on the reticle and on the wafer established by the illumination beam may be kept constant irrespective of the σ value selected.

As shown and described, the adjustment mechanism used in this embodiment is of a lens changing type. Alternatively, the adjustment mechanism may comprise a zoom-lens system disposed between the first and second fly-eye lenses 9 and 14 and associated with a magnification changer unit for operating the zoom lens system to change its magnification. By using such zoom-lens system, the extent of the illumination field on the entrance surface of the second fly-eye lens 14 may be continuously varied. This provides an advantage that high illuminances may be maintained on the reticle and on the wafer while the σ value is continuously varied.

The second fly-eye lens 14 in this embodiment comprises a pair of lens bundles 14a and 14b each including a plurality of tiny lens elements gathered into one piece of mosaic structure and each having one end surface formed to be a plane surface. The lens bundles 14a and 14b are disposed close to each other with their plane surfaces facing each other. Thus, the second fly-eye lens 14 is referred to as the "mosaic fly-eye lens" hereinafter.

Figure 3A:
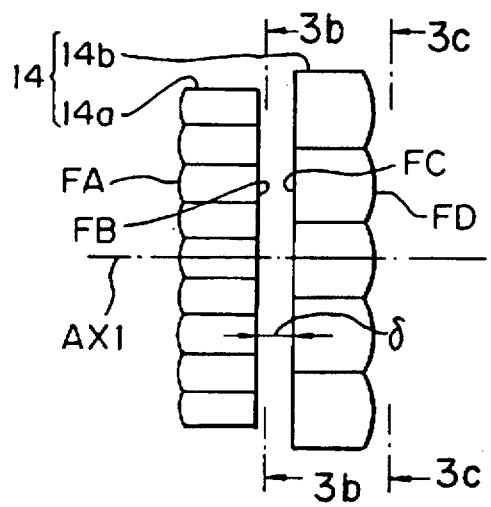
FIG. 3(a) is a magnified side elevation of a mosaictype-fly-eye-lens (the second fly-eye lens).

FIG. 3(a) is a side elevation of the mosaic fly-eye lens 14. As shown in this figure, the mosaic fly-eye lens 14 comprises the pair of lens bundles 14a and 14b disposed along the optical axis AX1 of the illumination optical system, with their plane surfaces FB and FC facing each other and establishing a spacing δ between them. The first lens bundle 14a, which is disposed closer to the light source than the second lens bundle 14b, comprises the lens elements each having one end surface that forms a part of the entrance surface FA so shaped as to provide a focal power. The second lens bundle 14b, which is disposed closer to the reticle than the first lens bundle 14a, comprises the lens elements each having one end surface that forms a part of the exit surface FD so shaped as to provide a focal power.

The focal power of each lens element is so selected that any collimated light beam entering the first lens bundle 14a from the light source side is converged on the exit surface FD of the second lens bundle 14b while any collimated light beam entering the second lens bundle 14b from the reticle side is converged on the entrance surface FA of the first lens bundle 14a. That is, the exit surface FD of the second lens bundle 14b defines a focal plane of the mosaic fly-eye lens 14, so that numerous images of the light source are formed on the exit surface FD. As understood, the pair of lens bundles 14a and 14b cooperate with each other, and they are capable of serving as a single fly-eye lens only when used together. Although FIGS. 3(a)-3(c) show the lens bundles 14a and 14b of the mosaic fly-eye lens 14 each including a particular number of lens elements, they do it by way of example only, and the number of the lens elements in each lens bundle may be selected depending on the required evenness in the illuminance distribution.

Figure 3B:
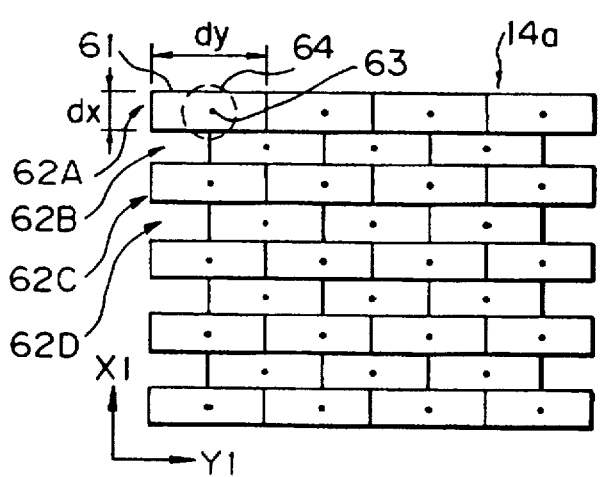
FIG. 3(b) is a front elevation along a 3b—3b line in FIG. 3(a).
Figure 3C:
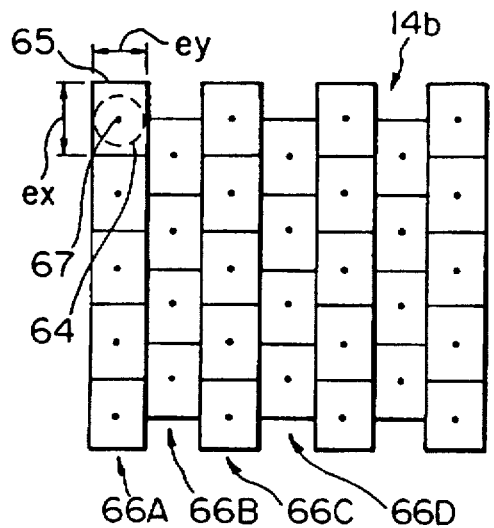
FIG. 3(c) is a front elevation along a 3c—3c line in FIG. 3(a).

FIG. 3(b) is a front elevation of the first lens bundle 14a as viewed from a plane indicated by line 3b—3b of FIG. 3(a), and FIG. 3(c) is a front elevation of the second lens bundle 14b as viewed from a plane indicated by line 3c—3c of FIG. 3(a). In these figures, the X1- and Y1-directions are indicated. The X1-direction corresponds to the scanning direction on the reticle in which the projection exposure apparatus of this embodiment scans the reticle during the scanning exposure operation, and the Y1-direction corresponds to the non-scanning direction on the reticle which is perpendicular to the scanning direction.

As shown in FIG. 3(b), the first lens bundle 14a comprises the lens elements 61, each of which has a cross section of an elongate rectangular shape with a size dx (in the X1-direction) by dy (in the Y1-direction), where dy>dx. The lens elements 61 are arranged in parallel lines extending in the Y1-direction without any spaces left between the adjacent lens elements. The group of the lens elements forming a first line is designated by 62A, the lens element group forming a second line by 62B, the lens element group forming a third line by 62C, and so on. The Y1-direction positions of the lens elements in odd lines, such as the first line 62A, the third line 62C, and so on, are in phase with each other, while those of the lens elements in even lines, such as the second line 62B, the fourth line 62D, and so on, are also in phase with each other. Further, the Y1-direction positions of the lens elements in odd lines and those of the lens elements in even lines are shifted in phase by one half of dy, the size of each lens element in the Y1-direction.

In this embodiment, the highest illumination efficiency is achieved when i) the entrance surface FA (FIG. 3(a)) of the first lens bundle 14a is positioned in a plane optically conjugate to the plane of the pattern bearing surface of the reticle and ii) the cross section of each lens element 61 of the first lens bundle 14a is similar to the shape of the slit-like illumination area on the reticle. To satisfy the latter requirement, the ratio between the height (the size in the X1-direction) dx and the width (the size in the Y1-direction) dy of the cross section of each lens element 61 is chosen to be the same as the ratio between the width (the size in the scanning direction) and the length (the size in the non-scanning direction) of the slit-like illumination area on the reticle. As the result, the cross section of each lens element 61 is of an elongate rectangular shape extending in the Y1-direction (i.e., the direction corresponding to the non-scanning direction on the reticle). For example, the ratio dx:dy=1:3 may be chosen.

As shown in FIG. 3(c), the second lens bundle 14b comprises the lens elements 65, each of which has a cross section of a rectangular, nearly perfect square shape having a size ex (in the X1-direction) by ey (in the Y1-direction), where ex=2*dx, and ey=dy/2. The lens elements 65 are arranged in parallel lines extending in the X1-direction without any spaces left between the adjacent lens elements. The group of the lens elements forming a first line is designated by 66A, the lens element group forming a second line by 66B, the lens element group forming a third line by 66C, and so on. The X1-direction positions of the lens elements in odd lines, such as the first line 62A, the third line 62C, and so on, are in phase with each other, while those of the lens elements in even lines, such as the second line 62B, the fourth line 62D, and so on, are also in phase with each other. Further, the X1-direction positions of the lens elements in odd lines and those of the lens elements in even lines are shifted in phase by one half of ex, the size of each lens element in the X1-direction. As an example, when the ration dx:dy=1:3 is chosen for the cross section of each lens element 61 of the first lens bundle 14a, the cross section of each lens element 65 of the second lens bundle 14b will have the ratio ex:ey=2:1.5=4:3, resulting in a cross section of a nearly perfect square shape.

The first and second lens bundles 14a and 14b, having thus described arrangements, are aligned with each other such that one of the lens elements 61 of the first bundle 14a has its center aligned with corresponding one of the lens elements 65 of the second lens bundle 14a with respect to both the X1- and Y1-directions. By this alignment, the centers 67 of all the lens elements 61 of the first lens bundle 14a are aligned with the corresponding centers 67 of the lens elements 65 of the second lens bundle 14b with respect to both the X1- and Y1-directions.

The operation of and the effects obtained from the mosaic fly-eye lens 14 comprised of two separate lens bundles 14a and 14b will be described below. The mosaic fly-eye lens 14 used in this embodiment is a second-stage fly-eye lens. On each of the exit surfaces of the individual lens elements 65 of this second-stage fly-eye lens, there is formed an image of a group of many light source images formed on that portion of the exit surface of the first-stage fly-eye lens 9 (FIG. 1) which appears within the aperture of the variable stop 10. That is, the image formed on each of the exit surfaces of the individual lens elements 65 comprises a lot of tiny light source images uniformly distributed within an area of a circular shape, for example.

Therefore, the light source images formed on the exit surface of the mosaic fly-eye lens 14 are tiny light source images distributed within a circular area 64 which, if it is illustrated by its projection onto the end surface of the first lens bundle 14a, is centered to the center 63 of each lens element 61 as shown in FIG. 3(b). The circular area 64 is so shaped, because its shape has to be similar to the shape of the aperture of the variable stop 10 shown in FIGS. 2(a) and 2(b). It is noted that since the lens element 61 of the first lens bundle 14a used in this embodiment has a cross section of an elongate rectangular shape, a large aperture of the variable stop 10 results in the (projected) circular area 64 not confined in the end surface of each lens element 61. Therefore, if a single fly-eye lens composed of only one lens bundle which comprises a plurality of lens elements having the same cross section as the lens element 61 were used in place of the mosaic fly-eye lens 14, some of the light source images would not be formed, because the positions on which they should fall could not be on the end surface area of each lens element. This would result in a reduced illumination efficiency.

In contrast, the mosaic fly-eye lens 14 used in this embodiment includes a second lens bundle 14b disposed just behind the first lens bundle 14a, the second lens bundle 14b comprises a plurality of lens elements 65 having a cross section of a nearly perfect square shape as shown in FIG. 3(c), and the light source images formed are distributed within a circular area 64 centered to the center 67 of each lens element 65. Because the cross section of the lens element 65 is nearly perfectly square, the entire region of the circular area 64 is almost confined in the cross section of the lens element 65 even if the aperture of the variable stop 10 (FIGS. 2(a) and 2(b)) is set to be large. Thus, a number of the light source images to be formed but not actually formed due to the eclipse is reduced, resulting in an improvement in the illumination efficiency. A large number of light source images formed on the exit surface of the mosaic fly-eye lens 14 in this manner emit a corresponding large number of light beams, which are mingled together and used for illumination, so that high uniformity is achieved in the illumination distribution on the reticle as well as on the wafer.

Referring again to FIG. 1, the second lens bundle 14b of the mosaic fly-eye lens 14, i.e., the lens bundle disposed closer to the reticle than the other, is provided with an adjustment unit 15 for shifting the lens bundle 14b in directions perpendicular to the optical axis AX1 as well as for tilting (or swinging) it within a predetermined range. In this embodiment, the adjustment unit 15 is used to adjust the shift and/or the tilt (or swing) of the lens bundle 14b so as to compensate for any errors in the telecentricity of the illumination optical system. For example, upon a replacement of the mercury-vapor lamp 1 or a re-selection of illumination conditions (such as a change between an ordinary illumination method and a modified illumination method), the operation of the adjustment unit 15 is controlled by the main control system 19 so as to automatically correct the telecentricity.

As shown in FIG. 1, there is provided near the exit surface of the mosaic fly-eye lens 14 an illumination-system-aperture-stop disk 16 having a plurality of illumination system apertures of different types.

FIG. 4 shows the illumination-system-aperture-stop disk 16, which has four aperture stops arranged at positions angularly spaced from each other with equal angular intervals. They are an aperture stop 18A comprising an ordinary circular opening, an aperture stop 18B comprising a smaller circular opening for providing a reduced coherence factor or σ value, an aperture stop 18C comprising a ring-shaped opening for use in the annular illumination method, and an aperture stop 18D comprising a plurality of small openings arranged on an circle centered to the nominal position of this aperture stop for use in the modified illumination method. The illumination-system-aperture-stop disk 16 may be rotated to select any one of the four aperture stops to be used.

Referring again to FIG. 1, the main control system 19 controls the angular position of the illumination-system-aperture-stop disk 16 by means of an illumination-system-aperture-stop drive unit 17 including a drive motor. The mosaic fly-eye lens 14 emits an illumination beam IL, which passes the selected one of the aperture stops of the illumination-system-aperture-stop disk 16 into a beam splitter 31 having a transmittance of about 98%. The illumination beam, having passed through the beam splitter 31, passes through a first relay lens 34 to reach a movable blind (or variable field stop) including two movable blades 35A and 35B. This movable blind is indicated in the following by the designation "movable blind 35A, 35B". The movable blind 35A, 35B is positioned to lie in a Fourier transform plane of the exit surface of the mosaic fly-eye lens 14. That is, the movable blind 35A, 35B is positioned in a plane optically conjugate to the plane of the pattern bearing surface of the reticle R described below. There is disposed behind and close to the movable blind 35A, 35B a fixed blind 37 having an aperture of a fixed geometry.

The fixed blind 37 comprises a mechanical field stop having a rectangular aperture which may be defined by, for example, four knife edges surrounding the rectangular aperture. The rectangular aperture serves to define the geometry of the slit-like illumination area on the reticle. That is, the illumination beam IL is trimmed by the movable blind 35A, 35B and/or the fixed blind 37, then passes through a second relay lens 38 and a condenser lens 39, is reflected by a mirror 40, and illuminates the slit-like illumination area 41 on the reticle R with a uniform illumination distribution.

However, because the fixed blind 37 is positioned in a plane which is slightly displaced or defocused in the front or behind direction from a plane optically conjugate to the plane of the pattern bearing surface of the reticle R, the illuminance distribution in the periphery of the slit-like illumination area 41 on the reticle R is not uniform, but the illuminance in the periphery gradually decreases toward the edge with a certain gradient. In addition, the movable blind 35A, 35B serves to prevent the slit-like illumination area 41 from entering those areas on the reticle R which are not to be illuminated, which would otherwise occur during the start and the end of the scanning exposure operation. For this purpose, the movable blades 35A and 35B are supported by means of slide units 36A and 36B, respectively, for opening/closing movement. The slide units 36A and 36B compose a movable blind drive unit whose operation is controlled by the stage control system 46.

An image of that portion of the pattern on the reticle R which is then confined in the illumination area 41 is projected onto the surface of the wafer W and in a slit-like exposure field 47 on the wafer W. This projection is performed through an exposure lens system PL having a magnification ratio β (the value of β may be ¼ or ⅕, for example). In order to specify positions and directions in the disclosed arrangement, we use here a three-dimensional rectangular coordinate system with X-, Y- and Z-axes. The Z-axis extends in parallel to the optical axis of the projection optical system PL. The X-axis extends in the direction in which the reticle R and the wafer W are scanned during the scanning exposure operation (this is the "scanning direction"). As the result, the Y-axis extends in the so-called "non-scanning direction", which is parallel to the plane determined by the surface of the reticle R or the wafer W and perpendicular to the scanning direction. In this embodiment, the reticle R is held on a reticle scanning stage 42 which, in turn, is supported on a reticle base 43 for translation in the X-direction. The wafer W is held on a wafer stage 48 which is movable in the X-direction for carrying out the scan of the wafer W as well as in the Y-direction for positioning the wafer W. The wafer stage 48 further includes a Z-stage incorporated therein for positioning the wafer W in the Z-direction.

The reticle scanning stage 42 and the wafer stage 48 compose a stage drive unit, whose operation is controlled by the stage control system 46. During the scanning exposure operation, the stage control system 46 operates the reticle scanning stage 42 to move the reticle R in the +X-direction (or in the −X-direction) relative to the illumination area 41 at a specified velocity $V_R$ for scanning, while in synchronism therewith operates the wafer stage 48 to move the wafer W in the −X-direction (or in the +X-direction) relative to the exposure field 47 at a corresponding velocity $V_W$ (=β*$V_R$) for scanning a specified one of the shot areas on the wafer W. During these movements of the reticle R and the wafer W, the pattern on the reticle R is serially transferred onto the shot area by exposure. In addition, during the scanning exposure operation, the stage control system 46 operates the slide units 36A and 36B to control the position of the movable blind 35A, 35B. This control is performed in the manner as described below in detail with reference to FIGS. 6(a) to 6(c).

Figure 6A:
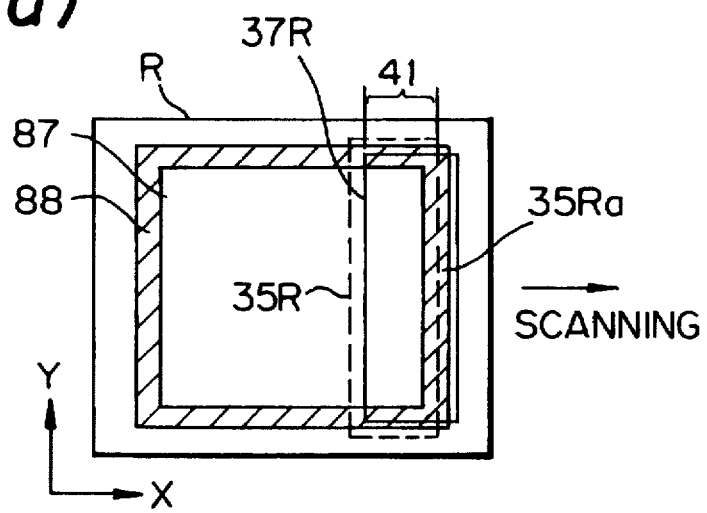
FIG. 6(a), FIG. 6(b) and FIG. 6(c) illustrate a movable blind with which a scanning exposure is performed in the embodiment.
Figure 6B:
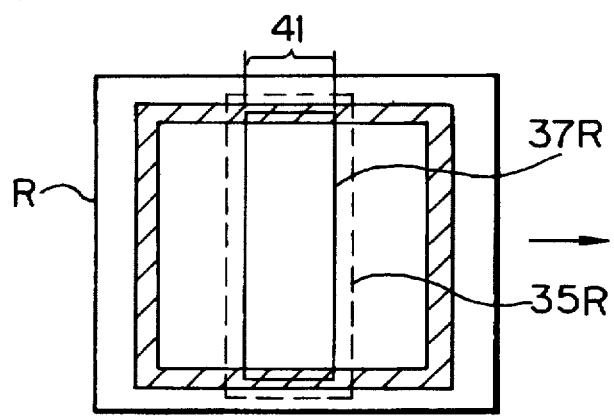
Figure 6C:
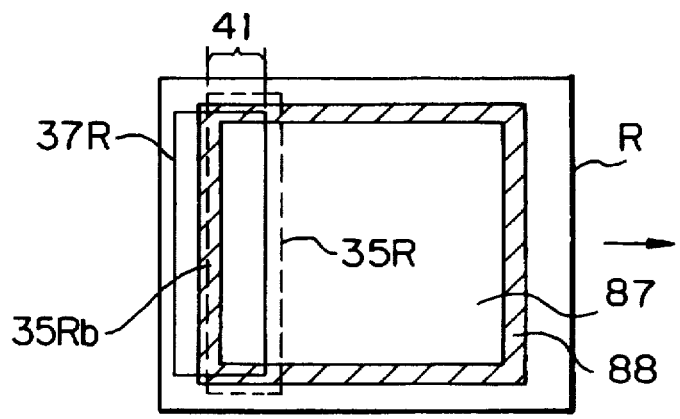

FIG. 6(a) shows the reticle R at the start of the scanning exposure operation. As shown, the reticle R has a shading band 88 formed thereon, which is of a rectangular ring shape and surrounds the central, pattern area 87 of the reticle R. In FIG. 6(a), the fixed-blind-imaging-area 37R (i.e., the area corresponding to the image of the aperture of the fixed blind 37 (FIG. 1) which would be formed on the reticle R if the movable blades were retracted) extends out of the outer boundary of the shading band 88. Therefore, in order to prevent undesirable exposure of the area not to be exposed, one movable blade 35B (FIG. 1) is moved such that the movable-blind-imaging-area 35R (i.e., the area corresponding to the image of the aperture of the movable blind 35A, 35B (FIG. 1) which would be formed on the reticle R if the fixed blind did not exist) may have its trailing edge 35Ra confined within the width of the shading band 88. Then, at the midway of the scanning exposure operation, when both of the leading and trailing edges of the fixed-blind-imaging-area 37R will lie in the pattern area 87 as shown in FIG. 6(b), the movable-blind-imaging-area 35R is set to include the entire fixed-blind-imaging-area 37R. Then, at the end of the scanning exposure operation, when a part of the fixed-blind-imaging-area 37R extends out of the outer boundary of the shading band 88 as shown in FIG. 6(c), the other movable blade 35A (FIG. 1) is moved such that the leading edge 35Rb of the movable-blind-imaging-area 35R may be confined within the width of the shading band 88. In this manner, the slit-like illumination area 41 on the reticle R is prevented from extending out of the outer boundary of the shading band 88, so that any undesirable exposure of the wafer W may be prevented.

FIG. 1 also shows an illuminance unevenness sensor 49 disposed on the wafer stage 48 and at a position near the wafer W. The illuminance unevenness sensor 49 comprises a photodetector having a photosensitive surface positioned at the level of the photosensitized surface of the wafer W, and produces a detection signal which is supplied to the main control system 19. The illuminance unevenness sensor 49 receives a part of illumination beam passing through an opening which has a pin-hole shape and is provided with a photosensitive surface thereof so that dispersion of illuminance on the exposure field is detected. In a measurement, after the wafer stage 48 is driven and then the opening of the illuminance unevenness sensor 49 is moved to the center of the exposure field 47, illuminance is measured at a plurality of points in the exposure field 47 as the wafer stage 48 is slightly moved so that dispersion of illuminance at the plurality of points in the exposure field 47 is determined.

Further, a radiation monitor 55 is provided next to the illuminance unevenness sensor 49, which monitor has a photoelectric detector which measures the quantity of light irradiated onto the exposure field 47. The radiation monitor 55 has a photosensitive surface which has a size larger than an area of the entire surface of the exposure field 47 and is positioned at the same height as that of the exposure surface of the wafer W similar to the case of the illuminance unevenness sensor 49. In a measurement, the wafer stage 48 is driven and then the entire exposure field 47 is covered with the photosensitive surface so that the quantity of light irradiated to the photosensitive surface is measured.

The signals outputted from the illuminance unevenness sensor 49 and the radiation monitor 55, respectively, are supplied to the main control system 19 which controls the dimmer plate 23 and the variable stop 10 through the exposure control system 20 based on those signals.

There is also disposed on the wafer stage 48 reference mark plate 50 used for the reticle alignment. The reference mark plate 50 has a reference mark 50a formed thereon, which comprises an aperture pattern. The reticle R has an alignment mark formed thereon, which is a mark corresponding to the reference mark 50a. When one reticle has been replaced with another, the reference mark plate 50 is moved into the effective exposure field of the projection optical system PL, and the reference mark 50a on the reference mark plate 50 is illuminated from the bottom side of the latter by an illumination light having the same wavelength band as the illumination beam IL. Using this illumination light, the images of the reference mark 50a and the alignment mark on the reticle R are observed through a mirror 45 disposed above the reticle R and by means of a reticle alignment microscope 44. Then, the observation is used to achieve the alignment of the reticle R with the reference mark plate 50.

Further, the reference mark plate 50 has another reference mark formed thereon, which is used to perform the focus calibration. A detection system for the focus calibration is disposed under this reference mark.

FIG. 5(a) shows the reference mark and the detection system for the focus calibration. As shown, the reference mark plate 50 has an opaque film attached on the top surface thereof, and the reference mark 50b comprises an aperture formed in the opaque film and having a cross shape, for example. The detection system 54 is disposed just under the reference mark 50b. The reference mark 50b is used to determine the image forming plane of the projection optical system PL in the manner described below. That is, in the detection system 54, illumination light rays having the same wavelength band as the illumination beam IL of FIG. 1 are directed through a bundle of optical fibers 81 into the inner space of the wafer stage 48 and emitted at the tip end of the optical fiber bundle 81 to pass through a collimator lens 82, a semitransparent mirror 83, and then a condenser lens 84, so as to illuminate the reference mark 50b from the bottom side of the reference mark plate 50. Some of the light rays pass through the reference mark 50b and form an image of the reference mark 50b on the pattern bearing surface of the reticle R by means of the projection optical system PL, and the reflected light rays from the pattern bearing surface return through the projection optical system PL to the reference mark 50b. Then, some or all of the return light rays pass through the reference mark 50b into the detection system 54, and then pass through the condenser lens 84, are reflected by the semitransparent mirror 83, and pass through another condenser lens 85 into a photodetector 86.

The photodetector produces a detection signal (an electrical signal obtained by the photoelectric conversion) S6, which is supplied to the main control system 19 of FIG. 1. By driving the Z-stage incorporated in the wafer stage 48 so as to continuously change the Z-direction position (or the height) of the reference mark 50b, the level of the detection signal S6 varies as illustrated by the curve shown in FIG. 5(b). The curve has a peak, at which the Z-coordinate of the reference mark 50b is coincident with the image forming plane of the projection optical system PL. Thus, the position of the image forming plane of the projection optical system PL can be determined from the shape of the detection signal S6. Once this position is determined, exposure operations can be made under good conditions by bringing the photosensitized surface of the wafer W to the determined position. In this manner, the calibration of the position of the image forming plane of the projection optical system PL (i.e., the focus calibration) is achieved by using the reference mark 50b of the reference mark plate 50.

Referring again to FIG. 1, the beam splitter 31 having a transmittance of about 98% reflects a small portion of the received illumination beam, called the leakage light. The leakage light passes through the condenser lens 32 into a photosensitive surface of an integrator sensor 33 which comprises a photodetector. The photosensitive surface of the integrator sensor 33 is positioned in a plane optically conjugate to, for example, the plane of the pattern bearing surface of the reticle R as well as to the plane of the photosensitized surface of the wafer W. The integrator sensor 33 produces a detection signal (an electrical signal obtained by the photoelectric conversion), which is supplied to the exposure control system 20. The detection signal is also supplied to the power supply system 22 for the mercury-vapor lamp 1 and the main control system 19 through the exposure control system 20.

The exposure control system 20 is connected with a memory 21 which stores information such as scale factors used to determine the quantity of light (exposure per unit time) irradiated on the wafer W based on the output signal of the integrator sensor 33. In this embodiment, the output signal of the integrator sensor 33 is calibrated using, for example, a predetermined reference illuminometer, and the memory 21 further stores correction factors used to correct the output signal of the integrator sensor 33 based on the calibration results.

Because the photosensitive surface of the integrator sensor 33 is positioned in a plane about conjugate to the plane of the pattern bearing surface of the reticle R, the detection signal from the integrator sensor 33 will not produce errors even when the illumination-system-aperture-stop disk 16 is rotated to replace an illumination-system-aperture-stop with another having a different shape. Alternatively, the photosensitive surface of the integrator sensor 33 may be positioned in an observation plane substantially conjugate to the Fourier transform plane of the pattern bearing surface of the reticle R with respect to the projection optical system PL (i.e., this Fourier transform plane is the pupil plane), so that the entire light rays passing through the observation plane may be received by the integrator sensor 33.

Moreover, in this embodiment, a condenser lens 52 and a wafer reflectance monitor 53 comprising a photodetector are disposed in the opposite side of the beam splitter 31 (whose transmittance is about 98%) to the integrator sensor 33. The wafer reflectance monitor has a photosensitive surface brought to a plane conjugate to the plane of the wafer surface by means of the condenser lens 52. A portion of the illumination beam passing through the reticle R and illuminated through the projection optical system PL onto the wafer W is reflected by the wafer W and return back through the projection optical system PL and the reticle R into the wafer reflectance monitor 53, which supplies a detection signal (an electrical signal obtained by the photoelectric conversion) to the main control system 19. The main control system 19 determines the light energy per unit time of the illumination beam passing through the projection optical system PL, using the light energy per unit time of the illumination beam IL illuminated through the reticle R, and the light energy per unit time of the light rays reflected by the wafer surface which is calculated from the detection signal produced from the wafer reflectance monitor 53. Further, the main control system 19 derives the thermal energy as a product of the thus determined light energy and the length of the exposure time, and uses the thermal energy to estimate the thermal expansion which would be caused in the projection optical system PL, so as to derive the possible variations in the image forming characteristics, such as distortions, of the projection optical system PL which would be caused by the estimated thermal expansion. Then, the main control system 19 corrects the image forming characteristics of the projection optical system PL through an image forming characteristics correction unit (not shown) operatively connected to the projection optical system PL, so as to restore the characteristics.

FIG. 7 shows a system diagram of a main section of the exposure control system which is described above. As shown in FIG. 7, the quantity of light of the illumination beam IL for exposure emitted from the mercury-vapor lamp 1 is controlled by the illumination-system-aperture-stop-disk 16, the variable stop 10 and the dimmer plate 23. Almost all (98%) of the illumination beam IL passes through the beam splitter 31 and then irradiates the reticle R. In the exposure control system, the quantity of exposure with the illumination beam IL is measured by four photoelectric sensors (photodetectors). The first photoelectric sensor is the integrator sensor 33 which measures the light energy per unit time by receiving the light reflected by the beam splitter 31 and which directly detects a part of the quantity of light of the illumination beam IL emitted from the mercury-vapor lamp 1. The second photoelectric sensor is the wafer reflectance monitor 53 which measures the light energy per unit time by receiving the light reflected by the beam splitter 31 in the light reflected by the wafer W. The main purpose of the second photoelectric sensor is to detect the quantity of light passing through the projection optical system PL to compensate the image forming characteristic of the projection optical system PL. The third and fourth photoelectric sensor are an illuminance unevenness sensor 49 and an illuminance monitor 55 whose photosensitive surfaces are in the plane including the surface of the wafer W. The illuminance unevenness sensor 49 detects illuminance unevenness of the exposure field and the illuminance monitor 55 detects the entire quantity of light irradiated to the exposure field.

Then, the values measured by the integrator sensor 33 are supplied to the exposure control system 20. The values measured by the integrator sensor 33 are also supplied to the main control system 19 through the exposure control system 20. The main control system 19 corrects the measured values to supply the exposure control system 20 with them. The exposure control system 20 controls the luminescence strength of the mercury-vapor lamp 1 through the power supply system 22 based on the corrected values as well as controlling the variable stop 10 and the dimmer plate 23 through a variable stop drive unit 11 and a dimmer plate drive unit 24, respectively. Values measured by the wafer reflectance monitor 53, the illuminance unevenness sensor 49 and the illuminance monitor 55, respectively, are supplied to the main control system 19 which controls a degree of opening of the illumination-system-aperture-stop-disk 16 through the illumination-system-aperture-stop drive unit 17 based on the measured values.

In the control system which has the construction described above, it is very important to high-accurately detect the quantity of exposure by the three photoelectric sensors. Particularly, because the photoelectric sensor for measuring the quantity of exposure is directly irradiated by a strong illumination beam, a change of temperature of the sensor itself, for example, a rise of temperature of the sensor causes a measurement error. Accordingly, in this embodiment, a measurement system which is able to cope flexibly with a change in temperature is provided as follows.

Figure 8A:
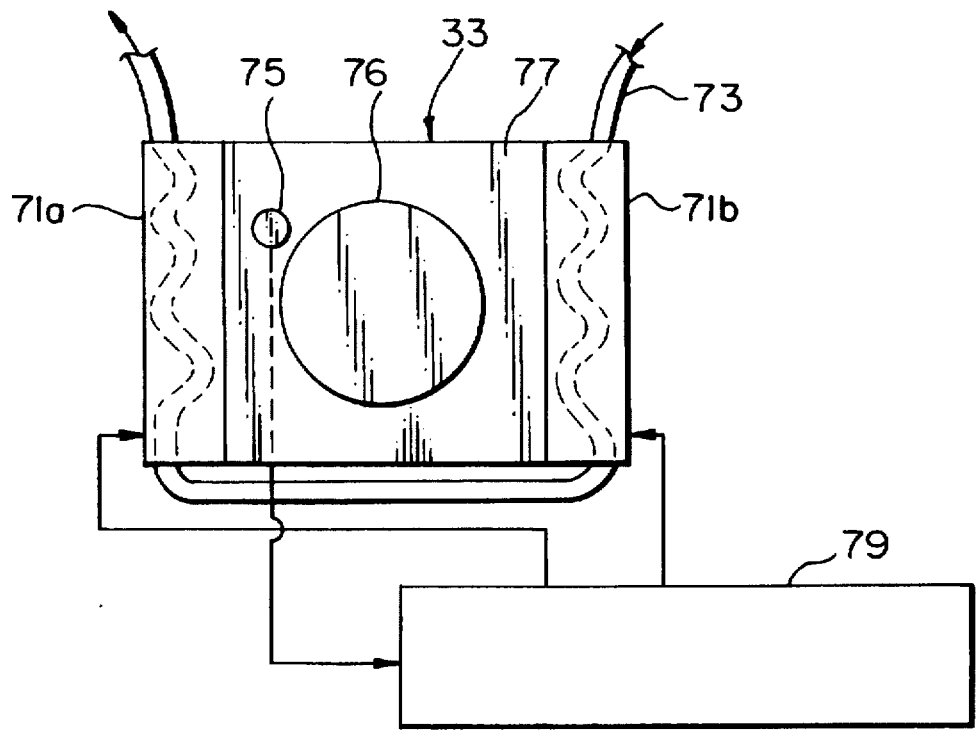
FIG. 8(a) is a magnified plan view of an integrator sensor.

FIG. 8(a) is a magnified plan view of the integrator sensor 33. In FIG. 8(a), heat exchangers 71a and 71b (Peltier devices) are fixed on right and left sides of a body of the integrator sensor 33. An outer portion of a circular irradiation field 76 which is positioned at the center of a photosensitive surface 77 of the integrator sensor 33 is made of a material having high thermal-conductivity. A heat absorption portion (a low temperature side) in the heat exchangers 71a and 71b is directly fixed to the outer portion. The heat produced when the illumination beam is irradiated to the irradiation field 76 is absorbed to the heat exchangers 71a and 71b through the right and left sides of the portion made of material with high thermal-conductivity. A cooling pipe 73 is fixed to a bottom surface of a heat release portion (a high temperature side) of the heat exchangers 71a and 71b so that heat of the heat release portion of the heat exchangers 71a and 71b is absorbed to cooling water circulating in the cooling pipe 73 which communicates with an outer temperature control apparatus (not shown).

A temperature sensor 75 is provided near the irradiation field 76, by which temperature of the circumference of the irradiation field 76 is always measured. The temperature measured by the temperature sensor 75 is supplied to a temperature control system 79 which controls electric power to be supplied to the heat exchanger 71a and 71b according to the measured temperature. The temperature measured by the temperature sensor 75 is also supplied to the main control system 19 which corrects the measured values of the quantity of light based on the measured temperature values. A temperature sensor (not shown) which measures the temperature of the heat release portion of the heat exchangers 71a and 71b may be provided. By providing such a temperature sensor, the outer temperature control apparatus can control the temperature and flow rate of the cooling water circulating through the cooling pipe 73 based on the temperature measured by the temperature sensor so that the temperature of the heat release portion of the heat exchangers 71a and 71b approaches the predetermined temperature.

Figure 8B:
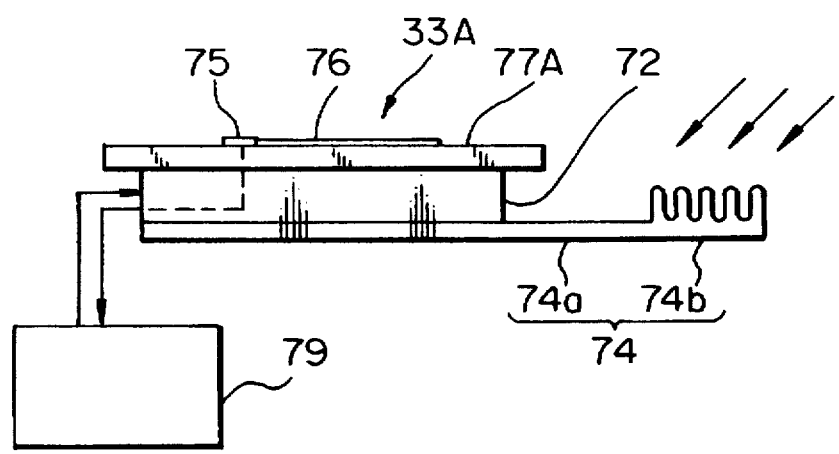
FIG. 8(b) is a front elevation which shows the modified embodiment of the integrator sensor.

FIG. 8(b) is a front elevation which shows the modified embodiment of the integrator sensor shown in FIG. 8(a). In FIG. 8(b), a heat exchanger 72 is fixed to a lower portion of a photosensitive surface 77A of an integrator sensor 33A so as to surround an irradiation field 76. The integrator sensor 33A is the same photoelectric sensor as the integrator sensor 33 shown in FIG. 8(a). A radiator plate 74 is fixed to the heat release portion of the heat exchanger 72, which has a heat pipe 74a and a heat radiation fin 74b. Heat of the photosensitive surface 77A is absorbed by a heat absorption portion (a low temperature side) in the heat exchanger 72 and then is released to the outside of the sensor from the heat radiation fin 74b formed at the distal end of the radiator plate 74 through a heat release portion in the heat exchanger 72 and the heat pipe 74a. Near to the heat radiation fin 74b, a cooling fan (not shown) is disposed, by which heat radiation from the heat radiation fin 74b is accelerated. The arrow shown in FIG. 8(b) shows an air current provided from the cooling fan.

In the embodiment shown in FIG. 8(a), the photosensitive surface 77 of the integrator sensor 33 is cooled by the heat exchangers 71a and 71b which include the Peltier device. When the capacity of the heat exchangers 71a and 71b is insufficient, the photosensitive surface 77 of the integrator sensor 33 may be directly cooled by means of the liquid cooling method or the air cooling method. The heat exchangers 71a and 71b which include the Peltier device have a characteristic such that the heat absorption portion (the lower temperature side) and the heat release portion (the higher temperature side) in the heat exchanger can be changed to one another when the direction of an electric current supplied to the heat exchangers 71a and 71b is reversed. Accordingly, also when it is necessary to increase the temperature of the photosensitive surface 77, the heat exchangers 71a and 71b can be utilized. However, in this case, it is necessary for the cooling water circulating in the heat release portion to be changed to warm water. Therefore, if such a temperature control apparatus that the cooling water circulating in the heat release portion can be changed to warm water is provided, both cooling and heating of the photosensitive surface 77 can be attained.

Next, the action of the integrator sensor 33 during measuring the quantity of exposure will be described.

The temperature of the photosensitive surface 77 of the integrator sensor 33 changes according to the accumulated quantity of irradiation energy which is irradiated to the photosensitive surface 77. As the temperature of the photosensitive surface 77 changes, the sensitivity of the integrator sensor 33 changes. Therefore, even if the same quantity of light is irradiated to the photosensitive surface 77, if the temperature of the photosensitive surface 77 changes, the output from the integrator sensor 33 changes so that the quantity of light measured includes an error unless correction is effected. In the exposure measurement system of this embodiment, the relation between the quantity of exposure and the temperature of the photosensitive surface 77 of the integrator sensor 33, and the relation between the temperature of the photosensitive surface 77 of the integrator sensor 33 and the sensitivity of the integrator sensor 33 are determined in advance. Then, based on these relations determined in advance, the information about the quantity of light of the illumination beam which enters the integrator sensor 33 (for example, values outputted from the integrator sensor 33 and irradiation energy detected by the integrator sensor 33) is corrected. The method of the correction will be described in detail.

Figure 9A:
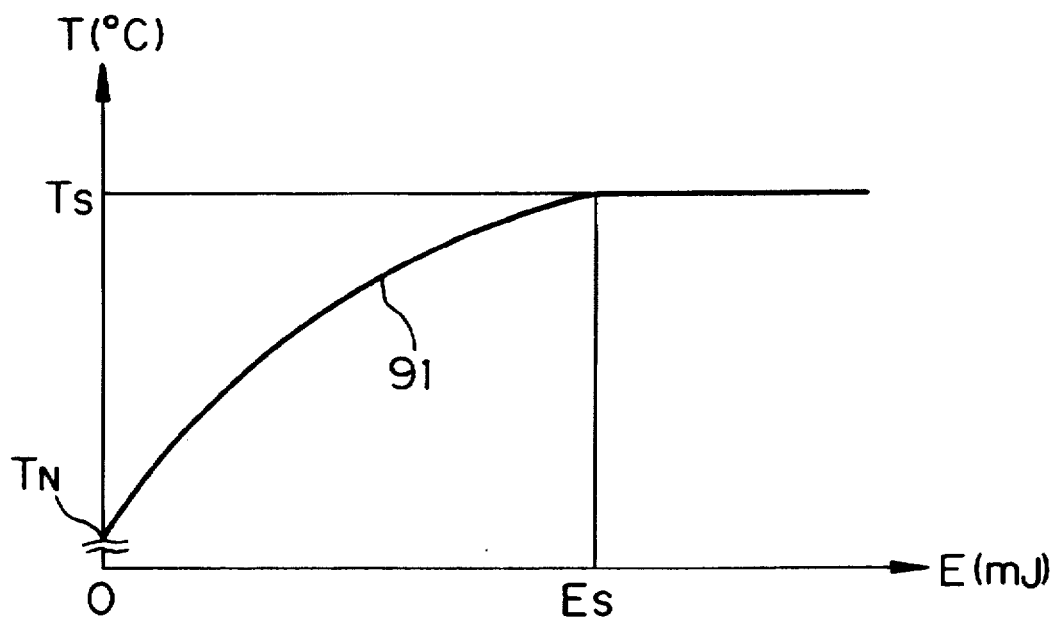
FIG. 9(a) is a graphic chart in which the relation between the irradiation energy accumulated onto the integrator sensor and temperature of the photosensitive surface of the integrator sensor is shown.

FIG. 9(a) is a graphic chart in which the relation between the irradiation energy irradiated onto the photosensitive surface 77 and a change of temperature of the photosensitive surface 77 is shown. In FIG. 9(a), an abscissae axis indicates the quantity of irradiation energy E (mJ) which is an integrated value of the light energy per unit time measured by the integrator sensor 33 and an ordinate axis indicates temperature T (° C.) of the photosensitive surface 77 measured by the temperature sensor 75. During measuring with the integrator sensor 33 and the temperature sensor 75, the operation of the heat exchangers 71a and 71b is stopped. Accordingly, as shown in FIG. 9(a), at first, when the quantity of irradiation energy E is "0", the temperature of the photosensitive surface 77 is reference temperature "$T_N$," and then as the quantity of irradiation energy E increases, the temperature of the photosensitive surface 77 rises as shown by a curved line 91. However, as the temperature of the photosensitive surface 77 rises, the quantity of heat exhaled from the photosensitive surface 77 increases. When the quantity of irradiation energy reaches "$E_S$", even if the quantity of irradiation energy increases much more, the temperature of the photosensitive surface 77 does not rise to higher than saturation temperature $T_S$ and, therefore, is maintained at the saturation temperature $T_S$. Here, the quantity of irradiation energy $E_S$ is the quantity of saturation energy. The saturation temperature $T_S$ and the quantity of saturation energy $E_S$ as well as the relation between the quantity of irradiation energy E and the temperature T of the photosensitive surface 77 which is indicated by the curved line 91 are memorized in the main control system 19. However, FIG. 9(a) shows the relation peculiar to that sensor and the relation is affected by environmental conditions surrounding the sensor, for example, temperature, humidity and etc. Therefore, based on FIG. 9(a), neither the quantity of irradiation energy E is calculated from the value of temperature T nor the temperature T is calculated from the quantity of irradiation energy E, but the relation shown in FIG. 9(a) can be used as a standard.

Figure 9B:
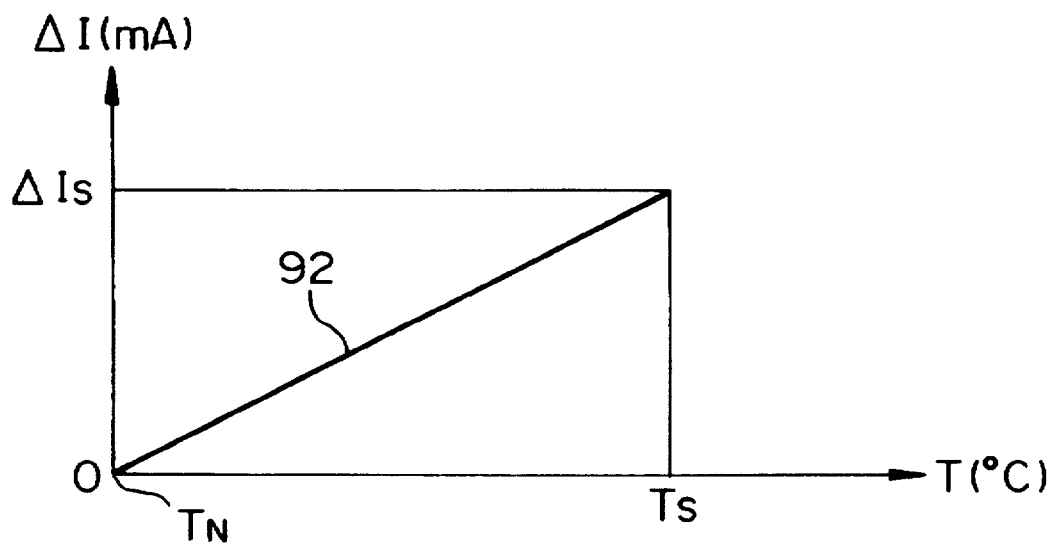
FIG. 9(b) is a graphic chart in which the relation between temperature of the photosensitive surface of the integrator sensor and a change of electric current outputted from the integrator sensor is shown.

On the other hand, FIG. 9(b) shows a change of value outputted from the integrator sensor 33 when temperature of the photosensitive surface 77 changes. In FIG. 9(b), an abscissae axis indicates temperature T (° C.) of the photosensitive surface 77 measured by the temperature sensor 75 and an ordinate axis indicates a change of electric current ΔI (mA) outputted from the integrator sensor 33. The relation shown in FIG. 9(b) is obtained in such a way that temperature T of the photosensitive surface 77 and the change of electric current ΔI outputted from the integrator sensor 33 are measured with the irradiation energy per unit time irradiated to the integrator sensor 33 being maintained at a constant level. In this case, the temperature T of the photosensitive surface 77 and the change of electric current ΔI may be measured with the illumination beam which has the constant quantity of the irradiation energy being continuously irradiated to the photosensitive surface 77 so that the temperature of the photosensitive surface 77 naturally rises. Also, they may be measured with the temperature of the photosensitive surface 77 being controlled by operating the heat exchangers 71a and 71b. The latter method is more convenient than the former method in that a reproducible result can be reliably obtained.

FIG. 9(b) shows a result measured until the irradiation energy E reaches the saturation quantity $E_S$ of irradiation energy. The change of electric current ΔI outputted from the integrator sensor 33 changes along a straight line 92 and is "0" when the temperature T is the reference temperature $T_N$ and is the saturated change of electric current $\Delta I_S$ when the temperature T is the saturation temperature $T_S$. As shown in FIG. 9(b), the relation between the change of electric current ΔI outputted from the integrator sensor 33 and the temperature T of the photosensitive surface 77 is about linear. The inclination of the straight line 92 is memorized in the main control system 19.

In this embodiment, as described above, the temperature sensor 75 which measures the temperature of the photosensitive surface 77 of the integrator sensor 33 is provided and then the temperature of the photosensitive surface 77 of the integrator sensor 33 measured by the sensor 75 is effectively utilized for correcting the measured value of the quantity of light irradiated to the photosensitive surface 77. The measured value of the quantity of light irradiated to the photosensitive surface 77 is corrected by one of the following methods (A) to (C) based on the relation obtained from FIG. 9(a) and 9(b).

(A) The method for measuring the irradiation energy with the heat exchangers 71a and 71b shown in FIG. 8(a) being operated so that the temperature of the photosensitive surface 77 of the integrator sensor 33 is controlled to the saturation temperature $T_S$.

Usually, the integrated value of the irradiation energy entering the integrator sensor 33 at actual exposure is larger than the saturation quantity $E_S$ of irradiation energy (FIG. 9(a)). Therefore, in almost all cases, the temperature of the photosensitive surface 77 reaches the saturation temperature $T_S$ so that even if the irradiation energy irradiated to the photosensitive surface 77 increase much more, the temperature of the photosensitive surface 77 is maintained at about constant. Therefore, in this method, after the temperature of the photosensitive surface 77 reaches about the saturation temperature $T_S$, the irradiation energy per unit time is measured as the heat exchangers 71a and 71b are operated so that the temperature of the photosensitive surface 77 is controlled to the saturation temperature $T_S$. As stated above, the information of inclination indicating the ratio of a change of sensitivity of the sensor 33 to the temperature of the photosensitive surface 77 is memorized in the main control system 19. Based on this information, the saturated change of electric current $\Delta I_S$ at the saturation temperature $T_S$ is obtained and then the irradiation energy per unit time detected by the integrator sensor 33 is corrected by the quantity of energy corresponding to the saturated change of electric current $\Delta I_S$.

As shown in FIG. 9(a), temperature of the photosensitive surface 77 is maintained at about constant temperature, i.e., the saturation temperature $T_S$ even if the quantity of the irradiation energy E increases much more than the saturation quantity $E_S$ of irradiation energy. However, it is not true that the temperature of the photosensitive surface 77 does not change at that time. When the quantity of the irradiation energy E increases much more than the saturation quantity $E_S$ of irradiation energy, the temperature of the photosensitive surface 77 actually gradually increases. Further, the saturation temperature $T_S$ of the photosensitive surface 77 changes according to environmental condition surrounding the integrator sensor 33. Accordingly, the irradiation energy is measured with the heat exchangers 71a and 71b being operated so that the temperature of the photosensitive surface 77 of the integrator sensor 33 is maintained at the saturation temperature $T_S$ memorized in the main control system 19. By doing so, a change in temperature of the photosensitive surface 77 is small in the vicinity of the saturation temperature $T_S$ even if the irradiation energy changes. Therefore, since the change of electric current outputted from the integrator sensor 33 is also small, the quantity of light irradiated to the integrator 33 can be accurately measured. Also, this method has an advantage in that the controllability of the heat exchangers 71a and 71b is not demanded so much.

As stated above, the surface of the heat exchangers 71a and 71b which touches the photosensitive surface 77 can be changed to the heat release portion (the higher temperature side) by reversely changing the direction of an electric current supplied to the heat exchangers 71a and 71b. Accordingly, the temperature of the photosensitive surface 77 can be quickly increased by the saturation temperature $T_S$ by controlling the direction of the electric current. Also, the temperature of the photosensitive surface 77 can be always maintained at the saturation temperature $T_S$. By doing so, a time for preparation before the measurement of the quantity of light is begun can be cut down so that productivity (throughput) rises.

In the method (A) stated above, even if the temperature of the photosensitive surface 77 is not maintained at the saturation temperature $T_S$, the quantity of light can be measured with the temperature of the photosensitive surface 77 being maintained at a predetermined temperature the same as or lower than the saturation temperature $T_S$ under operation of the heat exchangers 71a and 71b. In this case, it is necessary to obtain a change of electric current ΔI outputted from the integrator sensor 33 at the predetermined temperature. In this method, further, the heat exchangers 71a and 71b must be more accurately controlled than that in the method in which the temperature of the photosensitive surface 77 is maintained in the vicinity of the saturation temperature $T_S$. However, because the beginning of the measurement need not be waited until the temperature of the photosensitive surface 77 reaches the saturation temperature $T_S$, a time for preparation before the measurement is begun can be shorten.

In the method (A), the quantity of light is measured with the heat exchangers 71a and 71b being operated so that the temperature of the photosensitive surface 77 is controlled, while the quantity of light may be measured without using the heat exchangers 71a and 71b. Such a method will be described in the following method (B).

(B) The method for measuring the irradiation energy after the temperature of the photosensitive surface 77 of the integrator sensor 33 reaches in the vicinity of the saturation temperature $T_S$ without using the heat exchangers 71a and 71b.

As stated above, a change of temperature of the photosensitive surface 77 is small in the vicinity of the saturation temperature $T_S$, even if the quantity of light irradiated to the photosensitive surface 77 increases. Therefore, a change of electric current ΔI (drift) outputted from the integrator sensor 33 is about constant. As described above with respect to FIG. 9(b), the saturated change of electric current $ΔI_S$ at the saturation temperature $T_S$ is calculated in the main control system 19 from the inclination of the straight line 92. The irradiation energy per unit time detected by the integrator sensor 33 is corrected based on the saturated change of electric current $ΔI_S$. This method has such a convenience that a substantially stable measurement can be done without controlling the temperature of the photosensitive surface 77. Further, since only the temperature T of the photosensitive surface 77 is measured when the quantity of light is corrected, the aspects of apparatuses and control are advantageous. Although the heat exchangers 71a and 71b which can control the temperature of the photosensitive surface 77 are provided in the embodiment shown in FIG. 8(a), it is not necessary to provide them in the method (B).

In the methods (A) and (B) stated above, the saturation temperature $T_S$ or the heat exchangers 71a and 71b is utilized. However, it is necessary to wait for a rise in temperature of the photosensitive surface 77 to the saturation temperature $T_S$ in both methods (A) and (B). In order to avoid that, by the following method (C), the values measured by the integrator sensor 33 may be corrected.

(C) The method for utilizing neither the saturation temperature $T_S$ nor the heat exchangers 71a and 71b In this method, the quantity of light measured by the integrator sensor 33 are corrected based on temperature of the photosensitive surface 77 which is surveyed without controlling the temperature of the photosensitive surface 77. If the relation shown in FIG. 9(b) become clear, apart from the problems of measurement accuracy and controllability, the output values from the integrator sensor 33 can be corrected by only measuring the temperature of the photosensitive surface 77 with the temperature sensor 75. That is to say, the change of electric current ΔI can be obtained by both the temperature measured by the temperature sensor 75 and the inclination of the straight line 92 shown in FIG. 9(b).

If data with respect to the relation between irradiation time and the integrated irradiation energy irradiated during that irradiation time are collected when an illumination light is irradiated to the photosensitive surface 77 in actual exposure and then an average history of those data are memorized, a change in the temperature outline of the photosensitive surface 77 can be estimated from both the history and the relation (the function) shown in FIG. 9(a). Based on both the estimated temperature change and the relation shown in FIG. 9(b), the change of electric current (the quantity of drift) ΔI is calculated and then the values outputted from the integrator sensor 33 may be corrected by using the change of electric current ΔI.

The measures to be taken in the case where the output from the integrator sensor 33 changes because of a change temperature of the photosensitive surface 77 of the integrator sensor 33 so that the measured values of the irradiation energy per unit time include errors, have been described. Further, measurement errors also result from an angle of incidence of the illumination beam to the photosensitive surface 77 of the integrator sensor 33. In the present embodiment, a measurement can be also taken to cope with this situation. A change in the angle of incidence of the illumination beam occurs due to, for example, the shape, etc. of the aperture-stop selected from the illumination-system-aperture-stop disk 16.

Figure 10A:
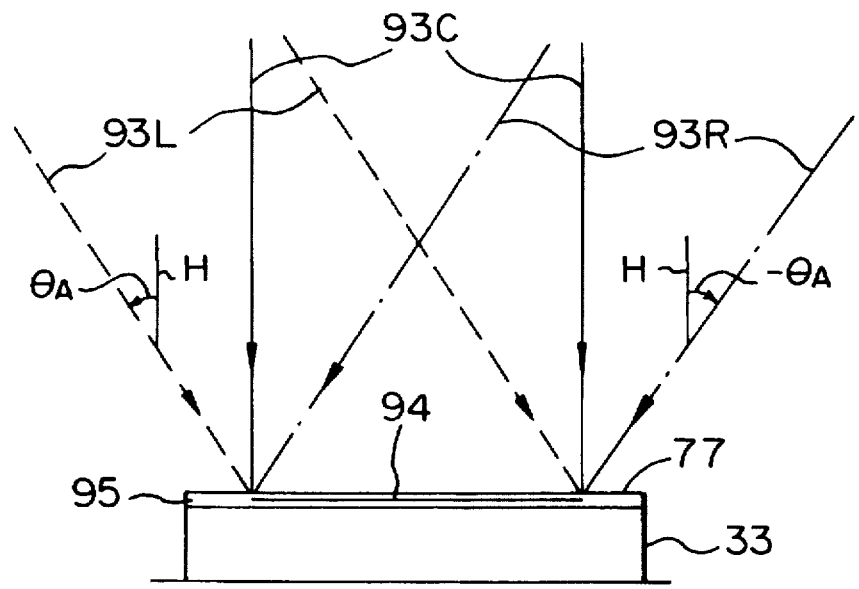
FIG. 10(a) is a front elevation in which the integrator sensor and three illumination beams which enter the photosensitive surface from the various directions are shown.

FIG. 10(a) shows three illumination beams which enter the integrator sensor 33. In FIG. 10(a), three illumination beams which enter the photosensitive surface 77 of the integrator sensor 33 are an illumination beam 93C which enters from the direction perpendicular to the photosensitive surface 77 and is indicated by a solid line, an illumination beam 93L which enters from the direction of the angle $θ_A$ with the line H perpendicular to the photosensitive surface 77 and oblique left, and is indicated by a dotted line, and an illumination beam 93R which enters from the direction of the angle $-θ_A$ with the line H perpendicular to the photosensitive surface 77 and oblique right, and is indicated by an alternate long and short dash line. The illumination beams 93C, 93L and 93R enter the same photosensitive field 94 in the photosensitive surface 77 of the integrator sensor 33 and illuminate the photosensitive surface 77 to the same degree. The photosensitive surface 77 of the integrator sensor 33 is covered with a protective film 95 through which each of the illumination beams 93C, 93L and 93R passes so as to enter the photosensitive surface. When output signal values emitted from the integrator sensor 33 with respect to the three illumination beams 93C, 93L and 93R are monitored, respectively, two curved lines shown in FIG. 10(b) are obtained.

Figure 10B:
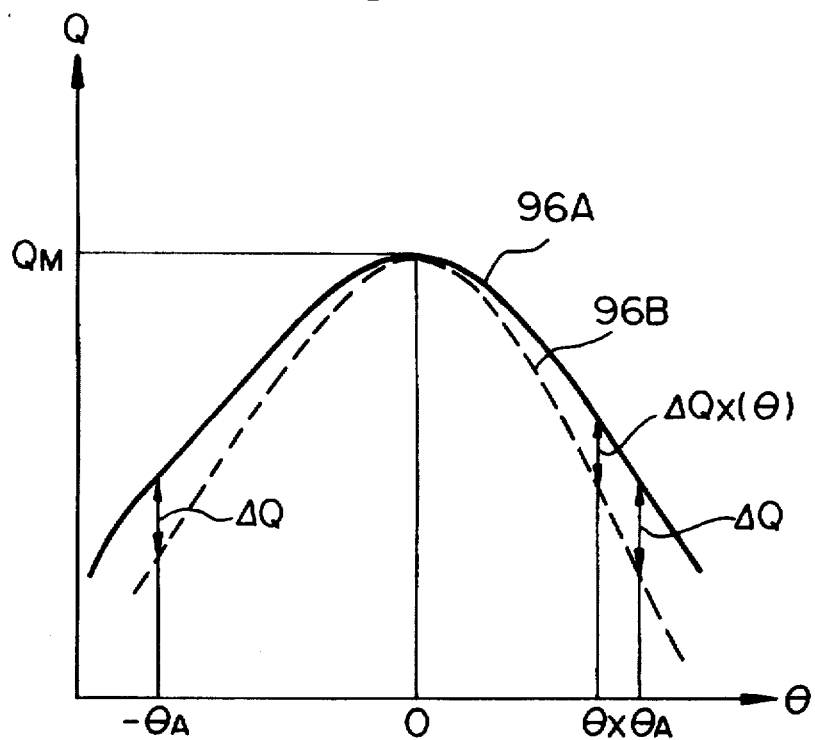
FIG. 10(b) is a graphic chart in which the relation between an angle of incidence of the illumination beam to the photosensitive surface and the output values from the integrator sensor is shown.
Figure 11:
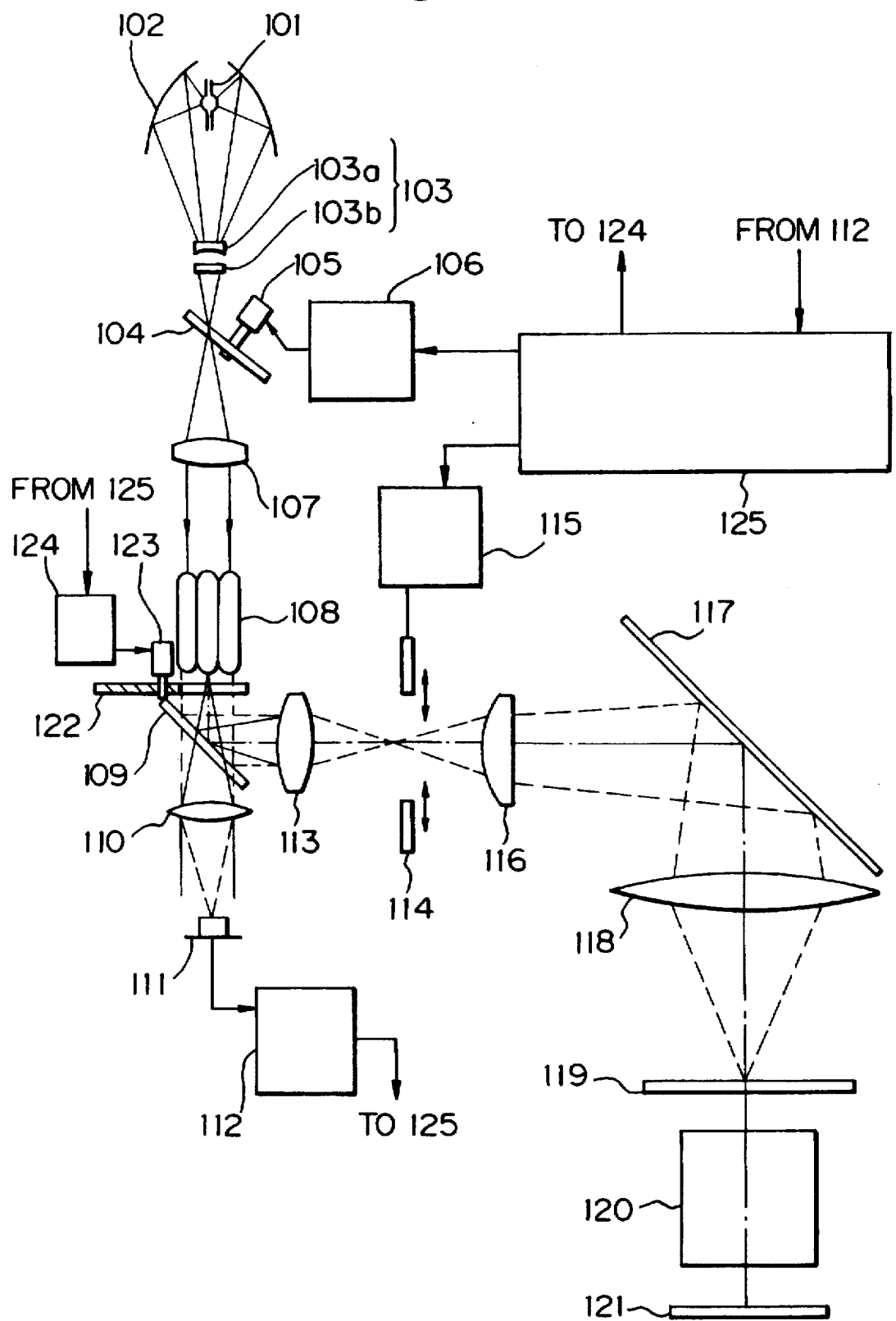
FIG. 11 schematically shows an arrangement of a conventional type of projection exposure apparatus.

FIG. 10(b) is a graphic chart in which the relation between the angle of incidence of the illumination beam to the photosensitive surface 77 of the integrator sensor 33 and the output signal value emitted from the integrator sensor 33 is shown. In FIG. 10(b), an abscissae axis indicates the angle of incidence θ and an ordinate axis indicates the output signal value Q. In FIG. 10(b), a curved line 96B indicated by a dotted line shows the relation between the angle of incidence and the output signal values which are actually measured, which curved line has a mountain-shape in which the output signal value Q is the maximum signal value $Q_M$ when the angle of incidence θ is "0" and the right side and the left side of the point at which the angle of incidence θ is "0" have the same shape as one another. Another curved line 96A indicated by a solid line shows the relation between the angle of incidence and the output signal value which are theoretically calculated, which curved line has a mountain-shape in which the maximum signal value $Q_M$ is the same as that of the curved line 96B and the output signal values Q are larger than those of the curved line 96B all over the curved line 96A. As shown in FIG. 10(b), when the angle of incidence θ is "0" (for example, the illumination beam 93C of FIG. 10(a)), the actually measured signal value is the maximum signal value $Q_M$ which is the same as that theoretically calculated. However, as the absolute value of the angle of incidence increases, the difference between the actually measured signal value and the theoretically calculated signal value is larger. When the angle of incidence is $θ_A$ or $-θ_A$ such as that of the illumination beam 93L or 93R of FIG. 10(a), the difference between the actually measured signal value and the theoretically calculated signal value is "ΔQ" in either case. That is to say, the difference between the actually measured signal value and the theoretically calculated signal value also is substantially symmetrical with respect to the line on which the angle of incidence θ is "0".

Such a phenomenon that the difference between the actually measured signal value and the theoretically calculated signal value is larger in proportion to the angle of incidence as stated above is due to the protective film 95 of the photosensitive surface 77 in FIG. 10(a), which is usually made of an oxidized film, etc. As the angle of incidence of the illumination beam is larger, the permeability, etc. of the protective film 95 decrease so that the quantity of light irradiated to the photosensitive surface 77 decreases.

Assuming that, in FIG. 10(b), the difference between the actually measured signal value and the theoretically calculated signal value at one angle of incidence $\theta_x$ is $\Delta\theta_x$, a function in which the relation between the difference $\Delta Q_x$ and the angle of incidence $\theta$ is defined is memorized in the main control system 19. Further, a change of the angle of incidence of the illumination beam which is due to the aperture stop in the illumination optical system, etc. is also measured in advance and the information of the change is also memorized in the main control system 19. Then, values measured by the integrator sensor 33 are corrected at the main control system 19 based on the information memorized in the main control system 19 after a measurement is taken. The method stated above is particularly effective as a measure to be taken when the angle of incidence of the illumination beam changes due to the aperture stop of the illumination optical system. The method is also utilized in order to make relative illuminance among exposure apparatuses equal one another, for example, in a process in which each of illuminance of a plurality of exposure apparatuses is adjusted to be equal each other (illuminance matching), etc.

By the embodiment described above, a change of sensitivity of the integrator sensor 33 for measuring the quantity of exposure which change is brought about by a change of temperature of the photosensitive surface thereof and a change of signals outputted from the integrator sensor 33 which change is brought about by a change of the angle of incidence of the illumination beam, are corrected. Further, the quantity of irradiation energy per unit time of the illumination beam which is irradiated to the exposure field 47 is high-accurately obtained so that the accumulated exposure to the wafer W is controlled so as to be exactly equal to the target value. Therefore, the pattern formed on the reticle R is transferred with high definition to the shot areas on the wafer W. Further, the construction of the present embodiment is effective in the scanning exposure type of projection exposure apparatus which needs a lot of quantity of light in particular since values measured by the integrator sensor 33 are not affected by the magnitude of the quantity of light. Therefore, the integrator sensor 33 can always provide with output signals having SN ratio more than a desirable value.

Although, in the embodiment stated above, a continuous light (from the mercury-vapor lamp) is used as a light source for exposure, a light source emitting a pulsed light such as an excimer laser light source may be used as a light source for exposure. In this case, the quantity of light can be measured by the integrator sensor based on an integrated value of one pulse and further the quantity of light can be also measured based on a maximum peak value of one pulse.

Although, in the embodiment stated above, the integrator sensor 33 has been explained, the present invention can be also applied to other photoelectric sensors which are used for measuring the quantity of light in the above embodiment, i.e., the illuminance unevenness sensor 49, the wafer reflectance monitor 53 and the irradiation monitor 55 shown in FIG. 7. Further, the present invention can be also applied to all systems for measuring the quantity of light which are not used in the above embodiment.

Further, the present invention can be also applied to the one-shot exposure type of projection exposure apparatus.

According to the exposure apparatus of the first aspect of the present invention, temperature of the photosensitive surface of the photoelectric sensor is measured by the temperature detector and then values measured by the photoelectric sensor are corrected by the correction system based on the relation between temperature of the photosensitive surface and a change of output from the photoelectric sensor which is obtained in advance. Accordingly, the quantity of light irradiated to the photosensitive surface of the photoelectric sensor can be accurately measured. Further, by providing the temperature controller and the correction system, even if the quantity of light changes large so that temperature of the photosensitive surface changes within a wide extent, it is not necessary to limit the quantity of light which enters the photoelectric sensor since values measured by the photoelectric sensor can be corrected. By doing so, such an inconvenience that the quantity of light which enters the photoelectric sensor is decreased in order to restrain a change of temperature as before so that SN ratio of output signal emitted from the photoelectric sensor is lowered, does not occur.

According to the exposure apparatus of the second aspect of the present invention, adding to the advantage brought about by the exposure apparatus of the first aspect of the present invention, the quantity of light can be measured with a change of output from the photoelectric sensor being invariable. In this case, productivity (throughput) is further improved since time until which temperature of the photosensitive surface reaches the desired temperature is cut down. Further, if the temperature of the photosensitive surface is set to the desired temperature with the temperature controller in advance before exposure, the measurement time is further shortened and, as a result, productivity is further improved.

According to the exposure apparatus of the third aspect of the present invention, only by obtaining the saturation temperature of the photosensitive surface of the photoelectric sensor and the characteristic of sensitivity of the photoelectric sensor at the saturation in advance, the quantity of light irradiated to the photosensitive surface of the photoelectric sensor can be accurately detected. In this case, such a temperature control device that is provided with the second exposure apparatus of the present invention is not necessary. Further, if the time at which temperature of the photosensitive surface reaches the saturation temperature is known in advance, such a temperature detector that is provided with the first and second exposure apparatuses of the present invention is not necessary. Accordingly, the third exposure apparatus has an advantage in aspects of both structure and control and also can accurately measure the quantity of light.

Further, in the first to third exposure apparatuses, the photoelectric sensor is at least one selected out of a group comprising a photoelectric sensor for measuring the quantity of light of a part of light flux separated from the illumination beam in the illumination optical system, a photoelectric sensor, which is provided on the same plane as a surface of the photosensitized substrate, for measuring the quantity of light of a part of the illumination beam which is irradiated onto the photosensitized substrate, and a photoelectric sensor, which is provided on the same plane as the surface of the photosensitized substrate, for measuring the quantity of light of the entire illumination beam which is irradiated onto the photosensitized substrate. Accordingly, the quantity of light irradiated during the actual exposure, illuminance unevenness during the actual exposure and the actual quantity of light irradiated during non-exposure can be accurately measured.

Although there have been shown and described several preferred embodiments of the present invention in detail, it should be understood that various changes, alterations and modifications may be made thereto and the present invention may be embodied in various other forms without departing from the spirit and the scope of the present invention as defined in the appended claims.

What is claimed is:

1. An exposure apparatus comprising:
   an illumination optical system for illuminating a mask on which a pattern to be transferred is formed with an illumination beam, said pattern on said mask being transferred onto a photosensitized substrate by exposure with said illumination beam;
   a photoelectric sensor for measuring the quantity of light of at least a part of said illumination beam;
   a temperature detector a for detecting temperature of a photosensitive surface of said photoelectric sensor; and
   a correction system for correcting information on the quantity of light measured by said photoelectric sensor based on the temperature detected by said temperature detector.

2. An exposure apparatus comprising:
   an illumination optical system for illuminating a mask on which a pattern to be transferred is formed with an illumination beam, said pattern on said mask being transferred onto a photosensitized substrate by exposure with said illumination beam;
   a photoelectric sensor for measuring the quantity of light of at least a part of said illumination beam;
   a temperature detector for detecting a temperature of a photosensitive surface of said photoelectric sensor; and
   a temperature controller for controlling the temperature of a photosensitive surface of said photoelectric sensor,
   said quantity of light of at least a part of said illumination beam being measured by said photoelectric sensor with said photosensitive surface of said photoelectric sensor being maintained at a predetermined temperature which is equal to or is lower than a saturation temperature by controlling said temperature controller based on values detected by said temperature detector.

3. An exposure apparatus comprising:
   an illumination optical system for illuminating a mask on which a pattern to be transferred is formed with an illumination beam, said pattern on said mask being transferred onto a photosensitized substrate by exposure with said illumination beam;
   a photoelectric sensor for measuring the quantity of light of at least a part of said illumination beam; and
   a memory for memorizing a characteristic of sensitivity of said photoelectric sensor at when a temperature of said photosensitive surface of said photoelectric sensor is equal to a saturation temperature,
   said quantity of light of at least a part of said illumination beam being calculated based on an output from said photoelectric sensor and said characteristic of sensitivity of said photoelectric sensor memorized in said memory, said output from said photoelectric sensor being obtained by measuring the quantity of light with said photoelectric sensor after the temperature of said photosensitive surface of said photoelectric sensor reaches substantially a constant saturation temperature.

4. An exposure apparatus comprising:
   an illumination optical system for illuminating a mask on which a pattern to be transferred is formed with an illumination beam, said pattern on said mask being transferred onto a photosensitized substrate by exposure with said illumination beam;
   a photoelectric sensor for measuring the quantity of light of at least a part of said illumination beam;
   a temperature detector for detecting a temperature of a photosensitive surface of said photoelectric sensor; and
   a memory for memorizing a relation between the temperature of said photosensitive surface of said photoelectric sensor and a characteristic of sensitivity of said photoelectric sensor at that temperature,
   said quantity of light of at least a part of said illumination beam being obtained in such a way that values measured by said photoelectric sensor when the temperature of said photosensitive surface of said photoelectric sensor is any temperature are corrected by use of said characteristic of sensitivity of said photoelectric sensor at said any temperature obtained from said relation.

5. An exposure method wherein a pattern to be transferred formed on a mask is illuminated with an illumination beam and is transferred onto a photosensitized substrate by exposure, said exposure method comprising the steps of:
   preparing a photoelectric sensor for measuring the quantity of light of at least a part of said illumination beam;
   detecting a temperature of a photosensitive surface of said photoelectric sensor;
   correcting information on the quantity of light measured by said photoelectric sensor based on temperature of said photosensitive surface detected by said temperature detector; and
   irradiating said illumination beam onto said photosensitized substrate in such a way that the accumulated exposure irradiated onto said photosensitized substrate, which is calculated based on the information on the quantity of light corrected in said correcting step, is equal to a predetermined quantity of exposure, so that said pattern is transferred onto said photosensitized substrate by exposure.

6. An exposure apparatus comprising:
   an illumination optical system for illuminating a mask on which a pattern to be transferred is formed with an illumination beam, said pattern on said mask being transferred onto a substrate by exposure with said illumination beam;
   a sensor for measuring the quantity of energy of at least a part of said illumination beam;
   a temperature detector for detecting a temperature of said sensor; and
   a correction system connected to said sensor and said temperature detector, said correction system correcting information measured by said sensor based on the temperature detected by said temperature detector.

7. An exposure apparatus as claimed in claim 6, further comprising:
   a mask stage for holding said mask; and
   a substrate stage for holding said substrate, said mask stage and said substrate stage moving synchronously in a scanning direction.

8. A scanning exposure apparatus for exposing a pattern onto a substrate in a scanning manner, said exposure apparatus comprising:
   an illumination optical system for illuminating said mask with an illumination beam;
   a sensor for measuring the energy of at least a part of said illumination beam;
   a temperature detector for detecting a temperature of said sensor; and
   a temperature controller connected to said sensor, said temperature controller controlling the temperature of said sensor.

9. A scanning exposure method wherein a pattern of a mask is exposed onto a substrate in a scanning manner, said method comprising the steps of:

preparing a sensor for measuring the energy of an illumination beam;

obtaining information on said sensor according to a temperature of said sensor; and correcting information measured by said sensor based on the temperature of said sensor.

10. A scanning exposure method wherein a pattern of a mask is exposed onto a substrate in a scanning manner, said method comprising the steps of:

preparing a sensor for measuring the energy of an illumination beam;

detecting a temperature of said sensor; and controlling the temperature of said sensor.

11. A scanning exposure method as claimed in claim 10, wherein said temperature of said sensor is controlled so that said temperature is a predetermined temperature which is equal to or is lower than a saturation temperature.

12. A scanning exposure method as claimed in claim 11, further comprising the steps of:

measuring said energy by said sensor at said predetermined temperature; and correcting information on said energy measured in said measuring step according to said predetermined temperature.

13. A scanning exposure method wherein a pattern of a mask is exposed onto a substrate in a scanning manner, said method comprising the steps of:

preparing a sensor for measuring the energy of an illumination beam; and memorizing a characteristic of sensitivity of said photoelectric sensor at when a temperature of said photoelectric sensor is equal to a saturation temperature.

14. A scanning exposure method as claimed in claim 13, further comprising steps of:

measuring said energy with said sensor after the temperature of said sensor reaches a substantially constant saturation temperature; and calculating said energy of said sensor and said characteristic of sensitivity of said sensor memorized in said memorizing step.

15. A scanning exposure method wherein a pattern of a mask is exposed onto a substrate in a scanning manner, said method comprising the steps of:

preparing a sensor for measuring the energy of an illumination beam;

detecting a temperature of said sensor; and memorizing a relation between the temperature of said sensor and a characteristic of a sensitivity of said sensor at that temperature.

16. A scanning exposure method as claimed in claim 15, further comprising steps of:

measuring said energy of said illumination beam by said sensor when the temperature of said photosensitive surface of said sensor is any temperature; and correcting said energy by use of said characteristic of sensitivity of said sensor at said any temperature obtained from said relation.

17. An exposure apparatus as claimed in claim 1, wherein:

said photoelectric sensor is at least one selected from a group comprising a photoelectric sensor for measuring the quantity of light of a light flux separated from said illumination beam in said illumination optical system, a photoelectric sensor, which is provided on the same plane as a surface of said substrate, for measuring the quantity of light of a part of said illumination beam which is irradiated onto said substrate, a photoelectric sensor, which is provided on the same plane as the surface of said substrate, for measuring the quantity of light of the entire illumination beam which is irradiated onto said substrate and a photoelectric sensor for measuring the quantity of light reflected by said substrate.

18. An exposure apparatus as claimed in claim 2, wherein:

said photoelectric sensor is at least one selected out of a group comprising a photoelectric sensor for measuring the quantity of light of a light flux separated from said illumination beam in said illumination optical system, a photoelectric sensor, which is provided on the same plane as a surface of said substrate, for measuring the quantity of light of a part of said illumination beam which is irradiation onto said substrate, a photoelectric sensor, which is provided on the same plane as the surface of said substrate, for measuring the quantity of light of the entire illumination beam which is irradiated onto said substrate and a photoelectric sensor for measuring the quantity of light reflected by said substrate.

19. An exposure apparatus as claimed in claim 3, wherein:

said photoelectric sensor is at least one selected out of a group comprising a photoelectric sensor for measuring the quantity of light of a light flux separated from said illumination beam in said illumination optical system, a photoelectric sensor, which is provided on the same plane as a surface of said substrate, for measuring the quantity of light of a part of said illumination beam which is irradiated onto said substrate, a photoelectric sensor, which is provided on the same plane as the surface of said substrate, for measuring the quantity of light of the entire illumination beam which is irradiated onto said substrate and a photoelectric sensor for measuring the quantity of light reflected by said substrate.

20. An exposure apparatus as claimed in claim 4, wherein:

said photoelectric sensor is at least one selected out of a group comprising a photoelectric sensor for measuring the quantity of light of a light flux separated from said illumination beam in said illumination optical system, a photoelectric sensor, which is provided on the same plane as a surface of said substrate, for measuring the quantity of light of a part of said illumination beam which is irradiated onto said substrate, a photoelectric sensor, which is provided on the same plane as the surface of said substrate, for measuring the quantity of light of the entire illumination beam which is irradiated onto said substrate and a photoelectric sensor for measuring the quantity of light reflected by said substrate.

21. An exposure method wherein a pattern to be transferred formed on a mask is illuminated with an illumination beam and is transferred onto a substrate by exposure, said exposure method comprising the steps of:

preparing a photoelectric sensor for measuring the quantity of light of at least a part of a light flux of said illumination beam;

detecting a temperature of a photosensitive surface of said photoelectric sensor;

controlling the temperature of a photosensitive surface of said photoelectric sensor at a predetermined temperature which is equal to or is lower than a saturation temperature based on the temperature of the photosensitive surface detected in said detecting step;

measuring said quantity of light by said photoelectric sensor at said predetermined temperature; and correcting information on said quantity of light measured in said measuring step according to said predetermined temperature.

22. An exposure method wherein a pattern to be transferred formed on a mask is illuminated with an illumination beam and is transferred onto a substrate by exposure, said exposure method comprising the steps of:

preparing a photoelectric sensor for measuring the quantity of light of at least a part of said illumination beam;

memorizing a characteristic of sensitivity of said photoelectric sensor at when a temperature of a photosensitive surface of said photoelectric sensor is equal to a saturation temperature;

measuring the quantity of light with said photoelectric sensor after the temperature of said photosensitive surface of said photoelectric sensor reaches a substantially constant saturation temperature; and calculating said quantity of light of at least a part of said illumination beam based on an output from said photoelectric sensor and said characteristic of sensitivity of said photoelectric sensor memorized in said memorizing step.

23. An exposure method wherein a pattern to be transferred formed on a mask is illuminated with an illumination beam and is transferred onto a substrate by exposure, said exposure method comprising the steps of:

preparing a photoelectric sensor for measuring the quantity of light of at least a part of said illumination beam;

detecting a temperature of a photosensitive surface of said photoelectric sensor;

memorizing a relation between the temperature of said photosensitive surface of said photoelectric sensor and a characteristic of sensitivity of said photoelectric sensor at that temperature;

measuring said quantity of light of at least a part of said illumination beam by said photoelectric sensor when the temperature of said photosensitive surface of said photoelectric sensor is any temperature; and correcting said quantity of light by use of said characteristic of sensitivity of said photoelectric sensor at any temperature obtained from said relation.

24. An exposure method as claimed in claim 21, further comprising the step of irradiating said illumination beam onto said substrate in such a way that the accumulated exposure irradiated onto said substrate, which is calculated based on the information on the quantity of light corrected in said correcting step, is equal to a predetermined quantity of exposure, so that said pattern is transferred onto said substrate by exposure.

25. An exposure method as claimed in claim 22, further comprising the step of irradiating said illumination beam onto said substrate in such a way that the accumulated exposure irradiated onto said substrate, which is calculated based on said quantity of light calculated in said calculating step, is equal to a predetermined quantity of exposure, so that said pattern is transferred onto said substrate by exposure.

26. An exposure method as claimed in claim 23, further comprising the step of irradiating said illumination beam onto said substrate in such a way that the accumulated exposure irradiated onto said substrate, which is calculated based on said quantity of light calculated in said calculating step, is equal to a predetermined quantity of exposure, so that said pattern is transferred onto said substrate by exposure.

27. An exposure method wherein a pattern is formed on a substrate while illumination beam is irradiated onto said substrate through an optical projection system and said illumination beam is relatively moved with respect to said substrate, said method comprising the steps of:

preparing a photoelectric sensor for measuring the quantity of light of at least a part of a light flux of an illumination beam which illuminates said mask;

detecting a temperature of said photoelectric sensor; and correcting information on the quantity of light measured by said photoelectric sensor based on the temperature detected in said detecting step.

28. An exposure method wherein a pattern is formed on a substrate while illumination beam is irradiated onto said substrate through an optical projection system and said illumination beam is relatively moved with respect to said substrate, said method comprising the steps of:

preparing a photoelectric sensor for measuring the quantity of light of at least a part of an illumination beam which illuminates said mask;

detecting a temperature of said photoelectric sensor;

controlling the temperature of said photoelectric sensor at a predetermined temperature which is equal to or is lower than a saturation temperature based on the temperature of the photoelectric sensor detected in said detecting step;

measuring said quantity of light by said photoelectric sensor at said predetermined temperature; and correcting information on said quantity of light measured in said measuring step according to said predetermined temperature.

29. An exposure method wherein a pattern is formed on a substrate while illumination beam is irradiated onto said substrate through an optical projection system and said illumination beam is relatively moved with respect to said substrate, said method comprising the steps of:

preparing a photoelectric sensor for measuring the quantity of light of at least a part of an illumination beam which illuminates said mask;

memorizing a characteristic of sensitivity of said photoelectric sensor at when a temperature of said photoelectric sensor is equal to a saturation temperature;

measuring the quantity of light with said photoelectric sensor after the temperature of said photoelectric sensor reaches a substantially constant saturation temperature; and calculating said quantity of light of at least a part of said illumination beam based on an output from said photoelectric sensor and said characteristic of sensitivity of said photoelectric sensor memorized in said memorizing step.

30. An exposure method wherein a pattern is formed on a substrate while illumination beam is irradiated onto said substrate through an optical projection system and said illumination beam is relatively moved with respect to said substrate, said method comprising the steps of:

preparing a photoelectric sensor for measuring the quantity of light of at least a part of a light flux of an illumination beam which illuminates said mask;

detecting a temperature of said photoelectric sensor;

memorizing a relation between the temperature of said photoelectric sensor and a characteristic of sensitivity of said photoelectric sensor at that temperature;

measuring said quantity of light of at least a part of said illumination beam by said photoelectric sensor when the temperature of said photoelectric sensor is any temperature; and correcting said quantity of light by use of said characteristic of sensitivity of said photoelectric sensor at any temperature obtained from said relation.

31. An exposure apparatus as claimed in claim 1, wherein said illumination beam includes light which is reflected by said substrate.

32. An exposure apparatus as claimed in claim 2, wherein said illumination beam includes light which is reflected by said substrate.

33. An exposure apparatus as claimed in claim 3, wherein said illumination beam includes light which is reflected by said substrate.

34. An exposure apparatus as claimed in claim 4, wherein said illumination beam includes light which is reflected by said substrate.

35. An exposure method as claimed in claim 5, wherein said illumination beam includes light which is reflected by said substrate.

36. An exposure method as claimed in claim 21, wherein said illumination beam includes light which is reflected by said substrate.

37. An exposure method as claimed in claim 22, wherein said illumination beam includes light which is reflected by said substrate.

38. An exposure method as claimed in claim 23, wherein said illumination beam includes light which is reflected by said substrate.

39. An exposure method as claimed in claim 21, further comprising the step of irradiating said illumination beam onto said substrate in such a way that the accumulated exposure irradiated onto said substrate, which is calculated based on the information on the quantity of light corrected in said correcting step, is equal to a predetermined quantity of exposure, so that said pattern is transferred onto said substrate by exposure.

40. An exposure method as claimed in claim 22, further comprising the step of irradiating said illumination beam onto said substrate in such a way that the accumulated exposure irradiated onto said substrate, which is calculated based on said quantity of light calculated in said calculating step, is equal to a predetermined quantity of exposure, so that said pattern is transferred onto said substrate by exposure.

41. An exposure method as claimed in claim 23, further comprising the step of irradiating said illumination beam onto said substrate in such a way that the accumulated exposure irradiated onto said substrate, which is calculated based on the quantity of light calculated in said calculating step, is equal to a predetermined quantity of exposure, so that said pattern is transferred onto said substrate by exposure.

42. An exposure method as claimed in claim 27, wherein said illumination beam includes light which is reflected by said substrate.

43. An exposure method as claimed in claim 27, wherein the step of detecting a temperature of said photoelectric sensor includes the step of detecting a temperature of a photosensitive surface of said photoelectric sensor.

44. An exposure method as claimed in claim 27, further comprising the step of irradiating said illumination beam onto said substrate in such a way that the accumulated exposure irradiated onto each shot region on said substrate, which is calculated based on the information on the quantity of light corrected in said correcting step, is equal to a predetermined quantity of exposure, so that said pattern is transferred onto said substrate by exposure.

45. An exposure method as claimed in claim 27, wherein a slit-like exposure region is formed on said substrate and said slit-like exposure region is relatively moved with respect to said substrate.

46. An exposure method as claimed in claim 27, wherein a mask, having a pattern to be transferred onto said substrate, is moved in synchronization with said substrate with respect to said illumination beam.

47. An exposure apparatus as claimed in claim 34, wherein the quantity of light for exposure to be irradiated onto said substrate is controlled on the basis of said obtained quantity of light.

48. An exposure method as claimed in claim 28, further comprising the step of irradiating said illumination beam onto said substrate in such a way that the accumulated exposure irradiated onto each shot region on said substrate, which is calculated based on the information on the quantity of light corrected in said correcting step, is equal to a predetermined quantity of exposure, so that said pattern is transferred onto said substrate by exposure.

49. An exposure method as claimed in claim 28, wherein the step of detecting a temperature of said photoelectric sensor includes the step of detecting a temperature of a photosensitive surface of said photoelectric sensor.

50. An exposure method as claimed in claim 28, wherein said illumination beam includes light which is reflected by said substrate.

51. An exposure method as claimed in claim 29, further comprising the step of irradiating said illumination beam onto said substrate in such a way that the accumulated exposure irradiated onto each shot region on said substrate, which is calculated based on the quantity of light calculated in said calculating step, is equal to a predetermined quantity of exposure, so that said pattern is transferred onto said substrate by exposure.

52. An exposure method as claimed in claim 29, wherein said illumination beam includes light which is reflected by said substrate.

53. An exposure method as claimed in claim 30, further comprising the step of irradiating said illumination beam onto comprising the step of irradiating said illumination beam onto said substrate in such a way that the accumulated exposure irradiated onto each shot region on said substrate, which is calculated based on said quantity of light calculated in said calculating step, is equal to a predetermined quantity of exposure, so that said pattern is transferred onto said substrate by exposure.

54. An exposure method as claimed in claim 30, wherein said illumination beam includes light which is reflected by said substrate.

55. An exposure apparatus as claimed in claim 6, wherein said illumination beam includes light which is reflected by said substrate.

56. An exposure apparatus as claimed in claim 6, wherein a slit-like exposure region is formed on said substrate and said slit-like exposure region is relatively moved with respect to said substrate.

57. An exposure apparatus as claimed in claim 6, wherein the quantity of light for exposure to be irradiated onto said substrate is controlled on the basis of said corrected measurement information.

58. A scanning exposure apparatus as claimed in claim 8, wherein said illumination beam includes light which is reflected by said substrate.

59. A scanning exposure apparatus as claimed in claim 8, wherein the quantity of light for exposure to be irradiated onto said substrate is controlled on the basis of output from said temperature-controlled sensor.

60. A scanning exposure apparatus as claimed in claim 8, wherein a slit-like exposure region is formed on said substrate and said slit-like exposure region is relatively moved with respect to said substrate.

61. A scanning exposure method as claimed in claim 9, wherein said illumination beam includes light which is reflected by said substrate.

62. A scanning exposure method as claimed in claim 9, wherein a slit-like exposure region is formed on said substrate and said slit-like exposure region is relatively moved with respect to said substrate.

63. A scanning exposure method as claimed in claim 62, wherein said mask is moved in synchronization with said substrate with respect to illumination beam.

64. A scanning exposure method as claimed in claim 9, wherein the quantity of light for exposure to be irradiated onto said substrate is controlled on the basis of said corrected measurement information.

65. A scanning exposure method as claimed in claim 9, wherein illumination condition of said illumination beam is adjusted by using said corrected measurement information.

66. A scanning exposure method as claimed in claim 65, wherein intensity of said illumination beam is adjusted.

67. A scanning exposure method as claimed in claim 65, wherein a diameter of aperture of said illumination beam is adjusted.

68. A scanning exposure method as claimed in claim 9, wherein said information on said sensor according to the temperature of said sensor is a temperature of said sensor.

69. A scanning exposure method as claimed in claim 9, wherein said information on said sensor according to the temperature of said sensor is a characteristic of sensitivity of said sensor according to the temperature of said sensor.

70. A scanning exposure method as claimed in claim 10, wherein said illumination beam includes light which is reflected by said substrate.

71. A scanning exposure method as claimed in claim 13, wherein said illumination beam includes light which is reflected by said substrate.

72. A scanning exposure method as claimed in claim 15, wherein said illumination beam includes light which is reflected by said substrate.

73. A scanning exposure method as claimed in claim 15, wherein the quantity of light for exposure to be irradiated onto said substrate is controlled on the basis of said relation.

74. A scanning exposure method as claimed in claim 73, wherein a slit-like exposure region is formed on said substrate and said slit-like exposure region is relatively moved with respect to said substrate.

75. A method for making a lithographic system comprising the steps of:
  providing a sensor which measures the quantity of energy of at least a part of an illumination beam;
  providing a temperature detector which detects a temperature of said sensor; and
  providing a correcting system which corrects information measured by said sensor.

76. A method as claimed in claim 75, wherein said illumination beam includes light which is reflected by said substrate.

77. A method as claimed in claim 75, wherein said lithographic system forms a slit-like exposure region on said substrate and a pattern is formed on said substrate while said slit-like exposure region is moved relative to said substrate.

* * * * *